(12) United States Patent
Kishino

(10) Patent No.: US 10,333,487 B2
(45) Date of Patent: Jun. 25, 2019

(54) ACOUSTIC WAVE ELEMENT, FILTER ELEMENT, AND COMMUNICATION DEVICE

(71) Applicant: KYOCERA CORPORATION, Kyoto-shi, Kyoto (JP)

(72) Inventor: Tetsuya Kishino, Kyoto (JP)

(73) Assignee: KYOCERA Corporation, Kyoto (JP)

( * ) Notice: Subject to any disclaimer, the term of this patent is extended or adjusted under 35 U.S.C. 154(b) by 202 days.

(21) Appl. No.: 15/500,474

(22) PCT Filed: Jul. 30, 2015

(86) PCT No.: PCT/JP2015/071595
§ 371 (c)(1),
(2) Date: Jan. 30, 2017

(87) PCT Pub. No.: WO2016/017730
PCT Pub. Date: Feb. 4, 2016

(65) Prior Publication Data
US 2017/0222624 A1     Aug. 3, 2017

(30) Foreign Application Priority Data

Jul. 30, 2014   (JP) .................. 2014-154480

(51) Int. Cl.
*H03H 9/02*      (2006.01)
*H03H 9/64*      (2006.01)
*H03H 9/145*     (2006.01)

(52) U.S. Cl.
CPC .... *H03H 9/02685* (2013.01); *H03H 9/02866* (2013.01); *H03H 9/14582* (2013.01); *H03H 9/64* (2013.01); *H03H 9/6483* (2013.01)

(58) Field of Classification Search
CPC .... H01L 41/047; H03H 9/25; H03H 9/02157; H03H 9/64; H03H 9/725; H03H 9/02685;
(Continued)

(56) References Cited

U.S. PATENT DOCUMENTS

2002/0105392 A1*  8/2002  Fujii ................. H03H 9/14505
                                                    333/193
2005/0190014 A1   9/2005  Saitou et al.
(Continued)

FOREIGN PATENT DOCUMENTS

EP      0936735 A2    8/1999
JP      S57-101413 A  6/1982
(Continued)

OTHER PUBLICATIONS

International Search Report dated Sep. 8, 2015 issued by the Japanese Patent Office in counterpart International Application No. PCT/JP2015/071595.
(Continued)

*Primary Examiner* — Robert J Pascal
*Assistant Examiner* — Jorge L Salazar, Jr.
(74) *Attorney, Agent, or Firm* — Procopio Cory Hargreaves and Savitch LLP

(57) ABSTRACT

An acoustic wave element of the present invention includes a piezoelectric substrate, an excitation electrode which is arranged on the piezoelectric substrate and includes a plurality of electrode fingers, and two reflectors arranged on the piezoelectric substrate, each of which includes a plurality of reflection electrode fingers, which sandwich the excitation electrode therebetween in the propagation direction of an acoustic wave. The excitation electrode includes a main region in the center vicinity of the line of the plurality of electrode fingers in which the intervals between the centers of the plurality of electrode fingers are uniformly a first interval. In the reflector, at least one of the reflection electrode fingers shifts to the excitation electrode side relative to virtual electrode finger positions which are repeatedly set at the first intervals from the electrode fingers in the main region.

20 Claims, 22 Drawing Sheets

(58) Field of Classification Search
CPC ........... H03H 9/02866; H03H 9/14582; H03H 9/6483
USPC .................................................. 333/133, 195
See application file for complete search history.

(56) References Cited

U.S. PATENT DOCUMENTS

| | | |
|---|---|---|
| 2009/0108960 A1 | 4/2009 | Igaki et al. |
| 2009/0273408 A1 | 11/2009 | Inoue et al. |
| 2012/0188026 A1 | 7/2012 | Yamaji et al. |
| 2012/0274421 A1 | 11/2012 | Hara et al. |
| 2014/0049340 A1 | 2/2014 | Inoue |

FOREIGN PATENT DOCUMENTS

| | | | |
|---|---|---|---|
| JP | 2005-244669 | A | 9/2005 |
| JP | 2007-214902 | A | 8/2007 |
| JP | 2009-272666 | A | 11/2009 |
| JP | 2011-114826 | A | 6/2011 |
| JP | 2012-138964 | A | 7/2012 |
| JP | 2012-156741 | A | 8/2012 |
| JP | 2014-039199 | A | 2/2014 |

OTHER PUBLICATIONS

Extended European Search Report dated Feb. 27, 2018, issued by the European Patent Office in counterpart European Patent Application No. 15 827302.9.
Ohmura Et al., A 900 MHz SAW resonator filter on $Li_2B_4O_7$ Crystal, Electronic Materials & Components Research Laboratories Nippon Mining Co, Ltd., Japan, 1990 Ultrasonics Symposium, pp. 135-138, Dec. 1990.

\* cited by examiner

ACOUSTIC WAVE ELEMENT, FILTER ELEMENT, AND COMMUNICATION DEVICE

TECHNICAL FIELD

The present invention relates to an acoustic wave element, filter element, and communication device.

BACKGROUND ART

In recent years, in mobile terminals and other communication devices, use has been made of an acoustic wave element for a duplexer for filtering signals transmitted and received to and from an antenna. An acoustic wave element is configured by a piezoelectric substrate and an excitation electrode which is formed on a major surface of the piezoelectric substrate. The acoustic wave element utilizes the feature that an electrical signal and a surface acoustic wave can be converted with each other due to the relationship between the excitation electrode and the piezoelectric substrate.

The duplexer for example forms a receiving filter and transmission filter by using a plurality of acoustic wave elements (see Japanese Patent Publication No. 2007-214902A). The duplexer combines a plurality of acoustic wave elements to set pass bands of the receiving band and transmission band.

SUMMARY OF INVENTION

Technical Problem

In such a duplexer, one of the topics is how to improve the characteristics of the pass band of the transmission band or receiving band.

The present invention was made in consideration with such a circumstance and has an object thereof to provide an acoustic wave element, filter element, and communication device capable of improving the characteristics of the pass bands of signals.

Solution to Problem

An acoustic wave element according to one aspect of the present invention includes a piezoelectric substrate; an excitation electrode which is arranged on the piezoelectric substrate and includes a plurality of electrode fingers; and two reflectors arranged on the piezoelectric substrate, each of which includes a plurality of reflection electrode fingers, which sandwich the excitation electrode in the propagation direction of the acoustic wave. Here, the excitation electrode includes a main region in the vicinity of the center of the line of the plurality of electrode fingers in which the intervals between the centers of the plurality of electrode fingers are uniformly a first interval. Each reflector includes a shift part in which at least one of the reflection electrode fingers shifts toward the excitation electrode side relative to virtual electrode finger positions which are repeatedly set at the first intervals from the electrode fingers in the main region.

A filter element according to one aspect of the present invention includes at least one series arm resonator which is connected between input and output terminals and at least one parallel arm resonator, where the parallel arm resonator is the above acoustic wave element.

A communication device according to one aspect of the present invention includes an antenna, the above filter element which is electrically connected to the antenna, and an RF-IC which is electrically connected to the filter element.

Advantageous Effect of Invention

According to the acoustic wave element, filter element, and communication device of the present invention, the characteristics in the pass band of signals can be improved.

BRIEF DESCRIPTION OF DRAWINGS

FIGS. 8A and 8B are graphs for comparing phase of the impedance characteristics of an acoustic wave element changed in the gap G in the case of FIG. 5, in which FIG. 8A shows the characteristics in a frequency band between a resonance frequency and an antiresonance frequency, and FIG. 8B shows the characteristics in a frequency band on the side where the frequency is higher by 1% than the antiresonance frequency.

DESCRIPTION OF EMBODIMENTS

Figure 1:
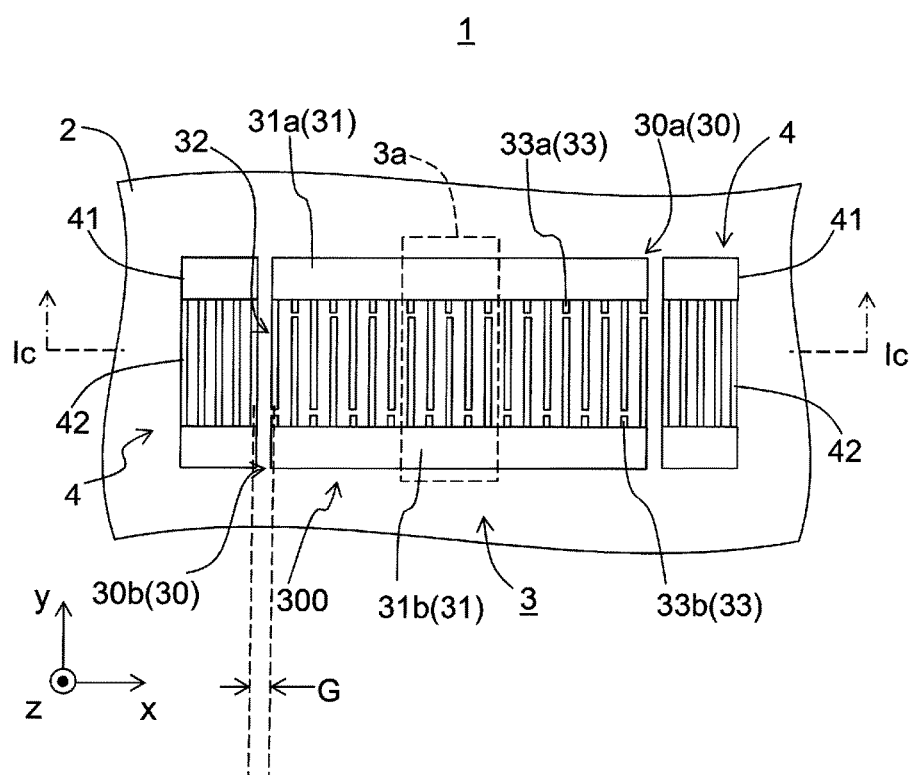
FIG. 1 is a plan view showing the configuration of an acoustic wave element according to an embodiment of the present invention.

Below, an acoustic wave element, filter element, and communication device according to embodiments of the present invention will be explained with reference to the drawings. Note that, the drawings used in the following explanation are schematic ones, and dimensions, ratios, etc. in the drawings do not always coincide with actual ones.

In an acoustic wave element, any direction may be defined as the "upper part" or "lower part". In the following description, however, for convenience, an orthogonal coordinate system xyz will be defined, and use will be made of "upper surface", "lower surface", and other terms while defining the positive side of the z-direction as the upper part.

<Summary of Configuration of Acoustic Wave Element>

Figure 2:
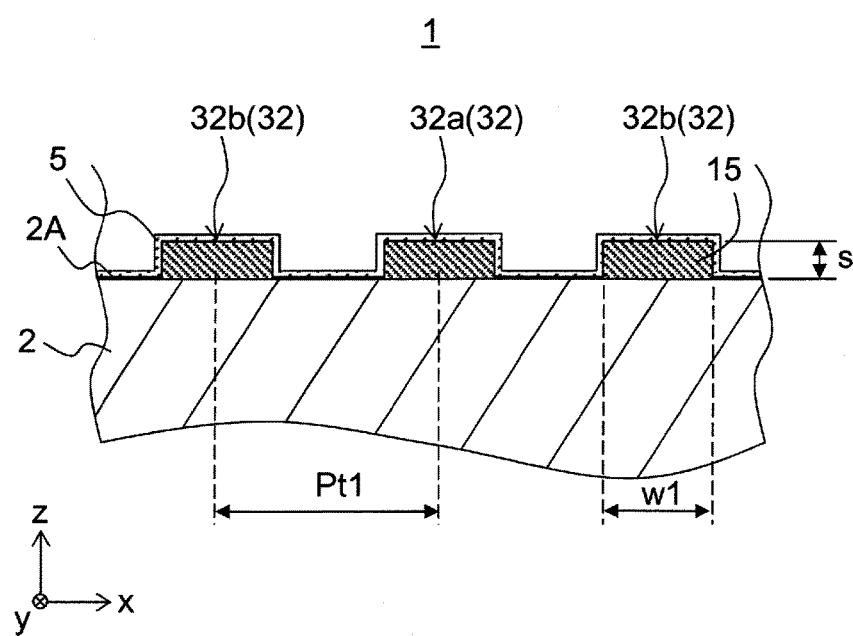
FIG. 2 corresponds to a cross-section cut along the Ic-Ic line in the acoustic wave element in FIG. 1.

FIG. 1 is a plan view showing the configuration of an acoustic wave element 1 using a surface acoustic wave (SAW) as one example of an acoustic wave element according to an embodiment of the present invention. Below, the acoustic wave element 1 will be abbreviated as a "SAW element 1". FIG. 2 is a cross-sectional view taken along the Ic-Ic line in FIG. 1. The SAW element 1, as shown in FIG. 1, has a piezoelectric substrate 2 and an excitation electrode 3 (hereinafter, described as an IDT (interdigital transducer) electrode 3) and reflectors 4 provided on an upper surface 2A of the piezoelectric substrate 2.

The piezoelectric substrate 2 is configured by a substrate of a single crystal having piezoelectricity made of a lithium niobate (LiNbO$_3$) crystal or lithium tantalate (LiTaO$_3$) crystal. Specifically, for example, the piezoelectric substrate 2 is configured by a 36° to 48° rotated Y cutX propagation LiTaO$_3$ substrate. The planar shape and dimensions of the piezoelectric substrate 2 may be suitably set. As an example, the thickness (z-direction) of the piezoelectric substrate 2 is 0.2 mm to 0.5 mm.

The IDT electrode 3, as shown in FIG. 1, has a first comb-shaped electrode 30a and second comb-shaped electrode 30b. Note that, in the following explanation, sometimes the first comb-shaped electrode 30a and second comb-shaped electrode 30b will be simply referred to as the "comb-shaped electrodes 30" and will not be distinguished.

The comb-shaped electrodes 30, as shown in FIG. 1, have two bus bars 31 which face each other and a plurality of electrode fingers 32 which extend from each bus bar 31 to the other bus bar 31 side. Further, the pair of comb-shaped electrodes 30 are arranged so that the first electrode fingers 32a and the second electrode fingers 32b mesh (cross) with each other in the propagation direction of the acoustic wave.

Further, the comb-shaped electrodes 30 have dummy electrode fingers facing electrode fingers 32 of each of them. A first dummy electrode finger 33a extends from the first bus bar 31a toward the second electrode finger 32b. A second dummy electrode finger 33b extends from the second bus bar 31b toward the first electrode finger 32a. Note that, dummy electrode fingers 33 need not be arranged at the comb-shaped electrodes 30.

The bus bars 31 are for example formed in long shapes extending straight with roughly constant widths. Accordingly, the edge parts of the bus bars 31 on the sides where they face each other form straight shapes. The plurality of electrode fingers 32 are for example formed in long shapes extending straight with roughly constant widths and arranged at roughly constant intervals in the propagation direction of the acoustic wave.

Note that, the widths of the bus bars 31 need not be constant. The edge parts in the bus bars 31 on the sides (inner sides) where they face each other need only be straight shapes. For example, the edge parts on the inner sides may be shaped as the bases of trapezoids.

Below, sometimes the first bus bar 31a and second bus bar 31b will be simply referred to as the "bus bars 31" and will not be distinguished as to the "first" and the "second". In the same way, sometimes the first electrode finger 32a and second electrode finger 32b will be simply referred to as the "electrode fingers 32" and the first dummy electrode finger 33a and second dummy electrode finger 33b will be simply referred to as the "dummy electrode fingers 33" and will not be distinguished as to the "first" and the "second".

The plurality of electrode fingers 32 of the pair of comb-shaped electrodes 30 configuring the IDT electrode 3 are aligned so that they are repeatedly arranged in the x-direction in the drawing. In more detail, as shown in FIG. 2, the first electrode finger 32a and the second electrode finger 32b are alternately repeatedly arranged at intervals on the upper surface 2A of the piezoelectric substrate 2.

In this way, the plurality of electrode fingers 32 in the pair of comb-shaped electrodes 30 configuring the IDT electrode 3 are set so as to have a pitch Pt1. The pitch Pt1 is the interval (repetition interval) between the centers of the plurality of electrode fingers 32. For example, it is set so as to become equal to a half-wavelength of the wavelength λ of the acoustic wave at the resonant frequency of the acoustic element. The wavelength λ (2×Pt1) is for example 1.5 μm to 6 μm. The IDT electrode 3 can generate an acoustic wave with a high efficiency since the plurality of electrode fingers 32 are arranged at a constant repetition interval by arranging almost all of the plurality of electrode fingers 32 so as to give the pitch Pt1.

Figure 3:
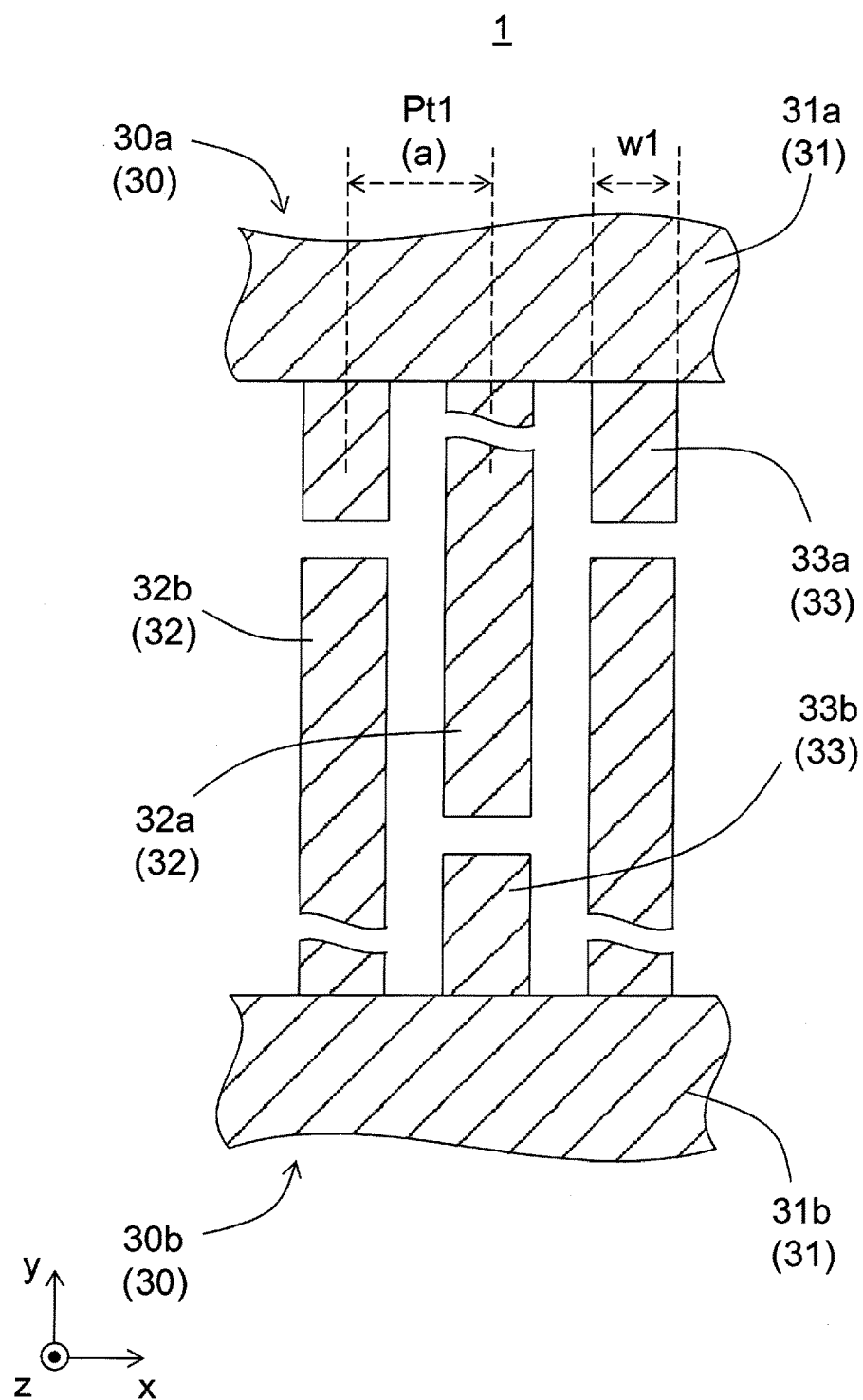
FIG. 3 is an enlarged plan view enlarging the portion of the excitation electrode in the acoustic wave element in FIG. 1.

Here, the pitch Pt1, as shown in FIG. 3, designates the interval from the center of the first electrode finger 32a up to the center of the second electrode finger 32b which is adjacent to this first electrode finger 32a in the propagation direction of the acoustic wave. In each electrode finger 32, the width w1 in the propagation direction of the acoustic wave is suitably set in accordance with the electric characteristics etc. which are requested from the SAW element 1.

The width w1 of the electrode finger 32 is for example 0.3 time to 0.7 time the pitch Pt1.

Such an IDT electrode 3 has a main region in the center vicinity 3a of the electrode fingers 32 in which the interval (pitch) from the center of the first electrode finger 32a up to the center of the second electrode finger 32b which is adjacent to this first electrode finger 32a is a constant first interval "a". The example shown in FIG. 1 to FIG. 3 shows a case where the pitch of the plurality of electrode fingers 32 is uniform in the entire region. That is, it shows a case where all of the IDT electrode 3 is configured by the main region.

Note that, in the IDT electrode 3, the pitch Pt1 may be made different from the first interval "a" in the vicinity of the two end parts of the line of the electrode fingers 32. Even in that case, in the acoustic wave excited in the IDT electrode 3 as a whole, an acoustic wave of a frequency determined by the first interval "a" in the center vicinity 3a where the amplitude strength of the acoustic wave is the highest becomes dominant.

An acoustic wave which is propagated in a direction perpendicular to these plurality of electrode fingers 32 is generated. Accordingly, considering the crystal orientation of the piezoelectric substrate 2, the two bus bars 31 are arranged so as to face each other in the direction intersecting with the direction in which the acoustic wave is desired to be propagated. The plurality of electrode fingers 32 are formed so as to extend in the direction perpendicular to the direction in which the acoustic wave is desired to be propagated. Note that, the propagation direction of the acoustic wave is identified by the orientation of the plurality of electrode fingers 32 and so on. In the present embodiment, for convenience, sometimes use will be made of the propagation direction of the acoustic wave as the standard for explanation of the orientation etc. of the plurality of electrode fingers 32.

The lengths of the plurality of electrode fingers 32 (lengths from the bus bars 31 up to the tip ends of the electrode fingers 32) are for example set to be roughly the same. Note that, the lengths of the individual electrode fingers 32 may be changed as well. For example, they may be made longer or shorter toward the propagation direction as well. Specifically, by changing the lengths of the individual electrode fingers 32 with respect to the propagation direction, an apodized IDT electrode 3 may be configured. In this case, a spurious noise in a lateral mode can be reduced, and the electric power resistance can be improved.

The IDT electrode 3, as shown in FIG. 2, is for example configured by a conductive layer 15 made of a metal. As this metal, there can be mentioned for example Al or an alloy using Al as a principal ingredient (Al alloy). The Al alloy is for example an Al—Cu alloy. Note that, the IDT electrode 3 may be configured by a plurality of metal layers as well. Various dimensions of the IDT electrode 3 are suitably set in accordance with the electrical characteristics etc. which are requested from the SAW element 1. The thickness S (z-direction) of the IDT electrode 3 is for example 50 nm to 600 nm.

The IDT electrode 3 may be directly arranged on the upper surface 2A of the piezoelectric substrate 2 or may be arranged on the upper surface 2A of the piezoelectric substrate 2 through another member. The other member is for example made of Ti, Cr, or an alloy of the same. In the case where the IDT electrode 3 is arranged on the upper surface 2A of the piezoelectric substrate 2 through another member, the thickness of the other member is set to a thickness of an extent having almost no influence upon the electrical characteristics of the IDT electrode 3 (for example a thickness of about 5% of the thickness of the IDT electrode 3 in the case of Ti).

Further, on the electrode fingers 32 configuring the IDT electrode 3, in order to improve the temperature characteristic of the SAW element 1, a mass-adding film may be laminated. As the mass-adding film, for example, use can be made of a film made of $SiO_2$ or the like.

The IDT electrode 3 excites an acoustic wave which is propagated in the x-direction in the vicinity of the upper surface 2A of the piezoelectric substrate 2 when a voltage is applied. The excited acoustic wave is reflected at a boundary with an area where no electrode fingers 32 are arranged (long region between adjoining electrode fingers 32). Further, a standing wave defining the pitch Pt1 of the electrode fingers 32 as the half-wavelength is formed. The standing wave is converted to an electrical signal having the same frequency as the standing wave and is extracted by the electrode fingers 32. In this way, the SAW element 1 functions as a single port resonator.

The reflectors 4 are arranged so as to sandwich the IDT electrode 3 in the propagation direction of the acoustic wave. Each reflector 4 is formed in a roughly lattice shape. That is, the reflector 4 has reflector bus bars 41 which face each other in the direction crossing the propagation direction of the acoustic wave and a plurality of reflector electrode fingers 42 which extend in the direction perpendicular to the propagation direction of the acoustic wave between these bus bars 41. The reflector bus bars 41 are for example formed in long shapes linearly extending with roughly constant widths and are arranged parallel to the propagation direction of the acoustic wave.

Figure 4:
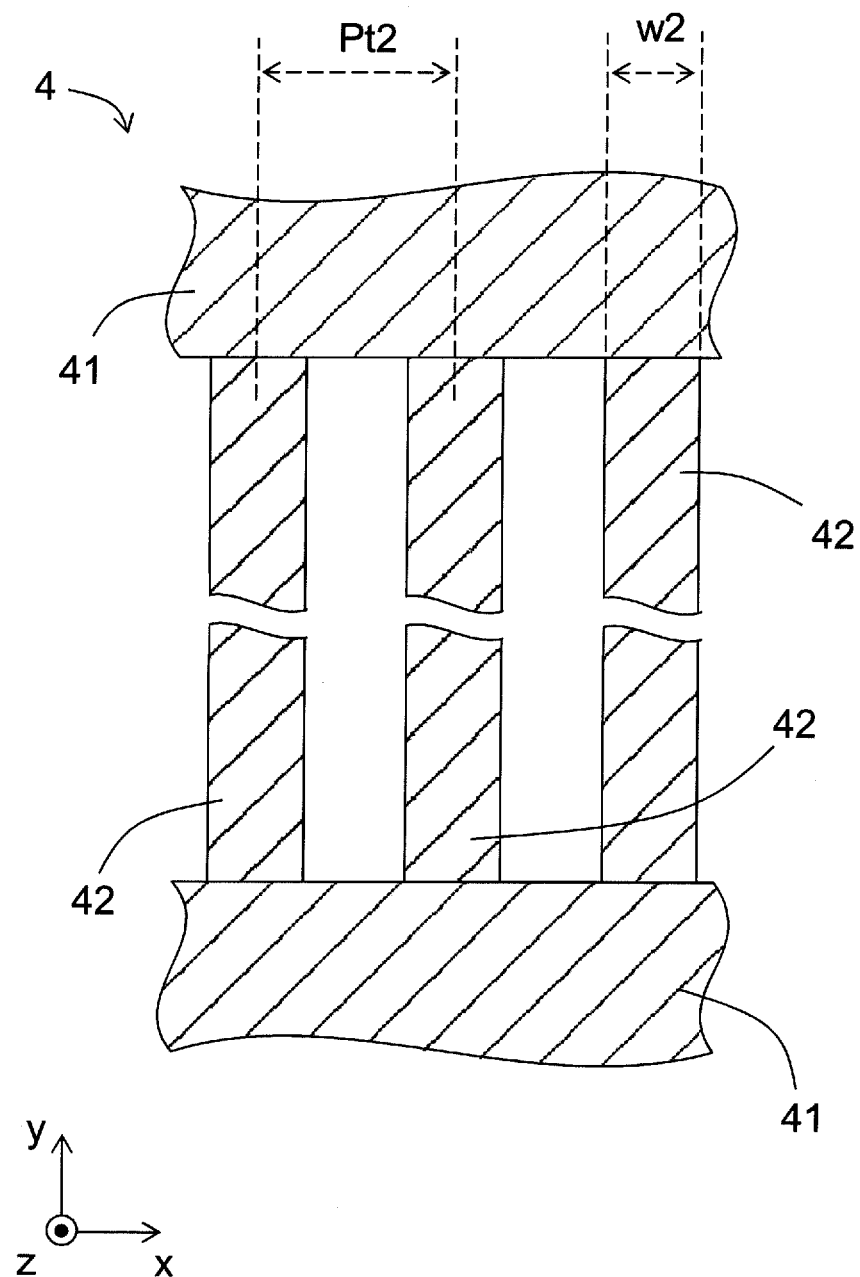
FIG. 4 is an enlarged plan view enlarging the portion of the reflector in the acoustic wave element in FIG. 1.

The plurality of reflector electrode fingers 42 are basically arranged at the pitch Pt2 for reflecting an acoustic wave excited in the IDT electrode 3. The pitch Pt2 is the interval (repetition interval) between the centers of plurality of reflector electrode fingers 42 and may be set to the same extent as the pitch Pt1 when the pitch Pt1 of the IDT electrode 3 is set to the half-wavelength of the wavelength λ of the acoustic wave. The wavelength λ (2×Pt2) is for example 1.5 μm to 6 μm. Here, the pitch Pt2, as shown in FIG. 4, designates the interval from the center of a reflection electrode finger 42 up to the center of an adjoining reflection electrode finger 42 in the propagation direction.

Further, the plurality of reflection electrode fingers 42 are formed in long shapes extending straight with roughly constant widths. The width w2 of a reflection electrode finger 42 can be for example set to substantially the same as the width w1 of an electrode finger 32. For example, the reflection electrode fingers are formed by the same material as that for the IDT electrode 3 and are formed to thicknesses equal to the IDT electrode 3.

Each reflector 4 is arranged at a gap G relative to the IDT electrode 3. Here, the "gap G" designates the interval from the center of the electrode finger 32 in the IDT electrode 3 which is positioned in the end part on the reflector 4 side up to the center of the reflection electrode finger 42 in the reflector 4 which is positioned in the end part on the IDT electrode 3 side. The gap G is usually set so as to become the same as the pitch Pt1 (or pitch Pt2) of the electrode fingers 32 positioned in the center vicinity 3a of the IDT electrode 3.

The protective layer 5, as shown in FIG. 2, is provided on the piezoelectric substrate 2 so as to cover the tops of the IDT electrode 3 and reflectors 4. Specifically, the protective layer 5 covers the surfaces of the IDT electrode 3 and reflectors 4 and covers the portions of the upper surface 2A of the piezoelectric substrate 2 which are exposed from the IDT electrode 3 and reflectors 4. The thickness of the protective layer 5 is for example 1 nm to 50 nm.

The protective layer 5 is made of an insulating material and contributes to protection of the conductive layer 15 from corrosion or the like. Preferably, the protective layer 5 is formed by $SiO_2$ or another material by which the speed of propagation of the acoustic wave becomes faster when the temperature rises. The change of the electrical characteristics due to the change of the temperature of the acoustic wave element 1 can be kept small by this as well.

In the SAW element 1 in the present embodiment, each reflector 4 is provided with a shift part in which at least one reflection electrode finger 42 is arranged shifted toward the IDT electrode 3 side from the pitch of the plurality of electrode fingers 32 configuring the IDT electrode 3. Here, the "pitch of the plurality of electrode fingers 32 configuring the IDT electrode 3" means virtual electrode finger positions which are repeatedly set at first intervals "a" from the electrode fingers 32 in the main region. The shift part may be configured by all of the reflection electrode fingers 42 configuring a reflector 4 or may be configured by a portion of the same.

In the present embodiment, the case where a reflection electrode finger 42 is arranged shifted toward the IDT electrode 3 side from the pitch of the plurality of electrode fingers 32 by making a reflector 4 approach the IDT electrode will be explained below.

In each reflector 4, the gap G from the IDT electrode 3 is set so as to become narrower than the pitch Pt1 (first interval "a") of the electrode fingers 32 which are positioned in the center vicinity 3a of the IDT electrode 3. Here, the pitch Pt1 of the electrode fingers 32 which are positioned in the center vicinity 3a of the IDT electrode 3 designates the pitch Pt1 of two or more electrode fingers 32 including at least the electrode finger 32 which is positioned at the center of the IDT electrode 3. That is, it designates the first interval "a".

In the present embodiment, for comparison with the gap G, an explanation will be given of the case where use is made of the pitch Pt1 of the electrode fingers 32 positioned in the center area 3a. For example, however, use may also be made of a mean value of pitches Pt1 of the electrode fingers 32 of the IDT electrode 3 or use may be made of the pitch Pt1 of the electrode fingers 32 which account for most of the IDT electrode 3.

The reflector 4 is arranged closer at a position where makes the gap G narrower in a range of for example 0.8 time to 0.975 time the usual interval (pitch Pt1 of the center vicinity 3a of the IDT electrode 3, i.e. first interval "a"). More preferably, the reflector 4 is arranged closer at a position where makes the Gap G narrower in a range of 0.8 time to 0.95 time. In other words, the reflector 4 is arranged closer at a position shifted to the IDT electrode 3 side by a distance of 0.05 time to 0.2 time the usual interval. In still other words, the reflector 4 is made to shift to the IDT electrode 3 side in a range of 0.025λ to 0.1λ.

Figure 5:
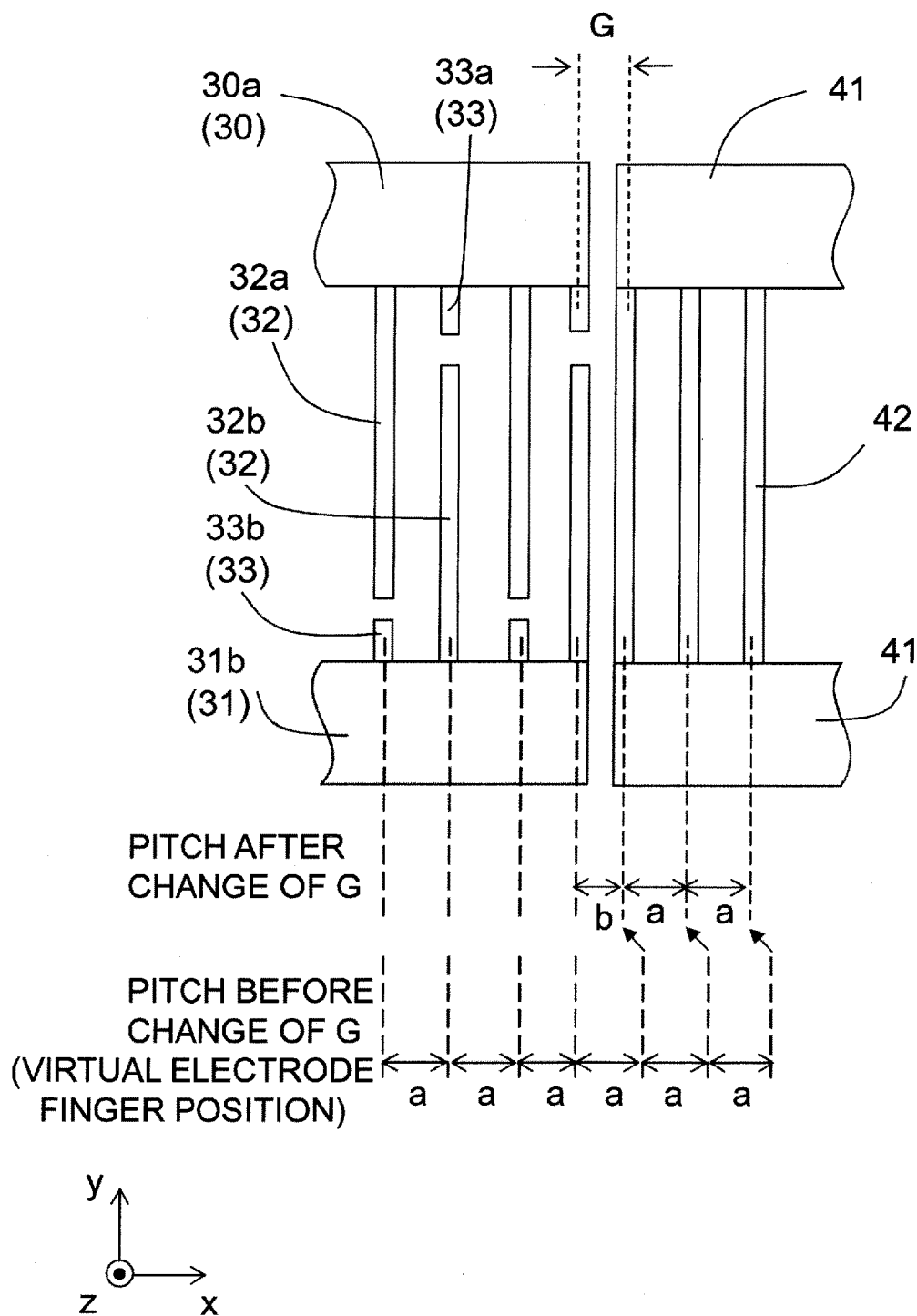
FIG. 5 is an enlarged plan view enlarging the portion of the excitation electrode and reflector in the acoustic wave element in FIG. 1.

By arranging each reflector 4 closer the IDT electrode 3 in this way, as shown in FIG. 5, the reflection electrode fingers 42 in the reflector 4 end up approaching the IDT electrode 3 side by more than the usual pitch. That is, all of the plurality of reflection electrode fingers 42 are shifted to the IDT electrode 3 side from their virtual electrode finger positions. All of the reflection electrode fingers 42 form the shift part.

By doing this, the loss of the resonator in the vicinity of the antiresonance point can be reduced. By arranging each reflector 4 closer to the IDT electrode 3, it is guessed that the phase of the acoustic wave (SAW) which is excited in the IDT electrode 3 and the phase of SAW which is reflected at the reflector 4 match well in the vicinity of the antiresonance point. For this reason, it becomes possible to prevent the SAW from being converted to another type of acoustic wave in the vicinity of the antiresonance point and being leaked from the resonator, therefore the loss of the resonator may be improved.

The case where each reflector 4 is placed closer to the IDT electrode 3 side as in the SAW element 1 in the present embodiment was evaluated by actually preparing SAW elements. The fundamental configurations of the prepared SAW elements are as follows.

Figure 6A:
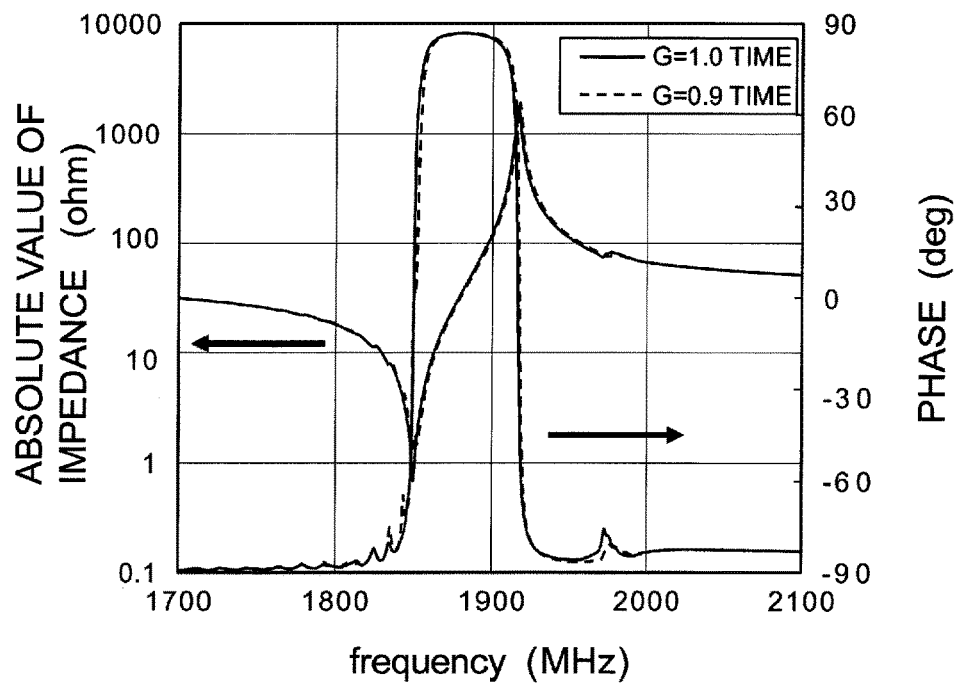
FIG. 6A shows the results of measurement of an impedance characteristic in an acoustic wave element changed in the gap G in the case of FIG. 5, and FIG. 6B enlarges a portion in FIG. 6A.
Figure 6B:
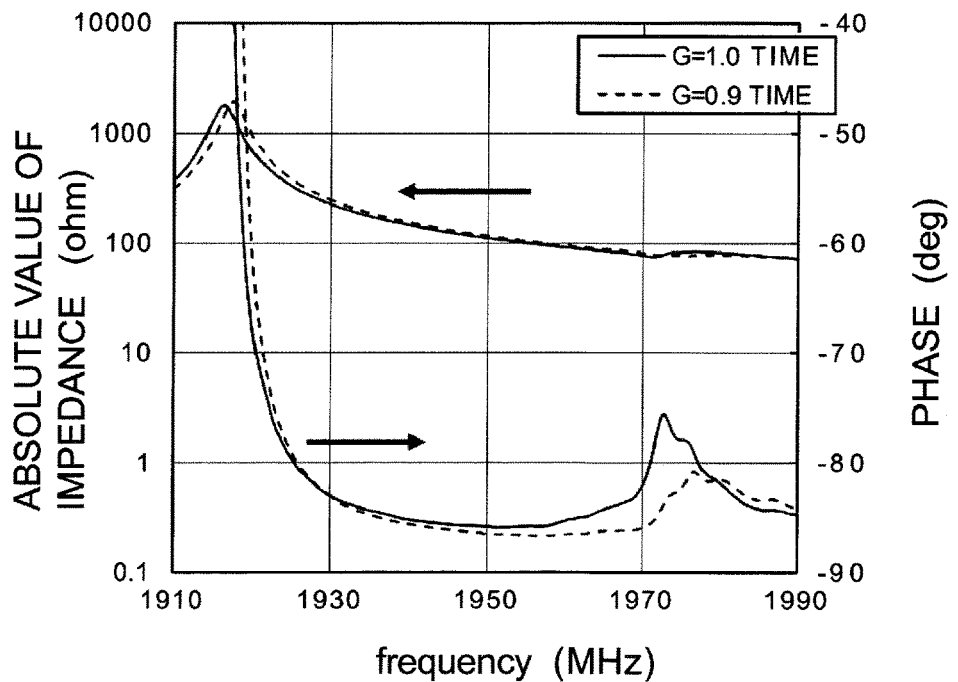

[Piezoelectric Substrate 2]
 Material: 42° Y-cut X-propagated $LiTaO_3$ substrate
[IDT Electrode 3]
 Material: Al—Cu alloy
 (however, there is an underlying layer made of Ti of 6 nm between the piezoelectric substrate 2 and the conductive layer 15)
 Thickness (Al—Cu alloy layer): 154 nm
 Electrode fingers 32 in IDT electrode 3:
 (Number) 200
 (Pitch Pt1) 1.06 μm
 (Duty: w1/Pt1) 0.5
 (Intersecting width W) 20λ (λ=2×Pt1)
[Reflector 4]
 Material: Al—Cu alloy
 (however, there is an underlying layer made of Ti of 6 nm between the piezoelectric substrate 2 and the conductive layer 15)
 Thickness (Al—Cu alloy layer): 154 nm
 Number of reflection electrode fingers 42: 30
 Intersecting width of reflection electrode fingers 42: 20λ (λ=2×Pt1)
 Pitch Pt2 of reflection electrode fingers 42: Pt1
 Gap G from IDT electrode 3: Pt1
[Protective layer 5]
 Material: $SiO_2$
 Thickness: 15 nm As the SAW element of the present embodiment, samples were prepared and evaluated for cases where the gap G between the IDT electrode 3 and the reflector 4 was set to 1.0 time and 0.90 time the pitch Pt1 of the center vicinity 3a of the IDT electrode 3. Note that, the case where the gap G is 1.0 time the pitch Pt1 is the usual case. The results of measurement for the prepared samples are shown in FIGS. 6A and 6B. In FIGS. 6A and 6B, the abscissas indicate the frequencies (MHz), the left ordinates indicate the impedances (ohm), and right ordinates indicate the phases (deg). It is seen from these results that the phase of impedance in the vicinity of the antiresonance point approaches −90° when the gap G is narrowed. On the higher frequency side from the antiresonance point, the phase of the impedance approaches −90° as the loss of the resonator becomes smaller. Therefore, from the above result, it is learned that there is the effect that the loss of the resonator is made smaller when the gap G is narrowed.

(Examination)

The improvement of the characteristics of the SAW element 1 as explained above was examined. As explained above, it is considered that by each reflector 4 being provided with the shift part, the loss on the higher frequency side from the antiresonance point becomes smaller by matching of the phases of the acoustic wave between the end part of the IDT electrode 3 and the end part of the reflector 4.

In addition to this mechanism, it is considered that the leakage of the acoustic wave to the thickness direction of the piezoelectric substrate 2 can be suppressed. Below, that mechanism will be studied.

A finite element model of a SAW element comprised of an IDT electrode 3 provided with 80 electrode fingers 32 and reflectors 4 arranged on the two ends of the IDT electrode 3 and each provided with 20 reflection electrode fingers 42 was prepared. Here, in the SAW element, the amount of energy leakage to the thickness direction of the piezoelectric substrate 2 was found by simulation for a case where a shift part was not provided in each reflector 4 and a case where a shift part in which the electrode fingers were shifted to the IDT electrode 3 side by exactly 0.1λ was provided.

Figure 7:
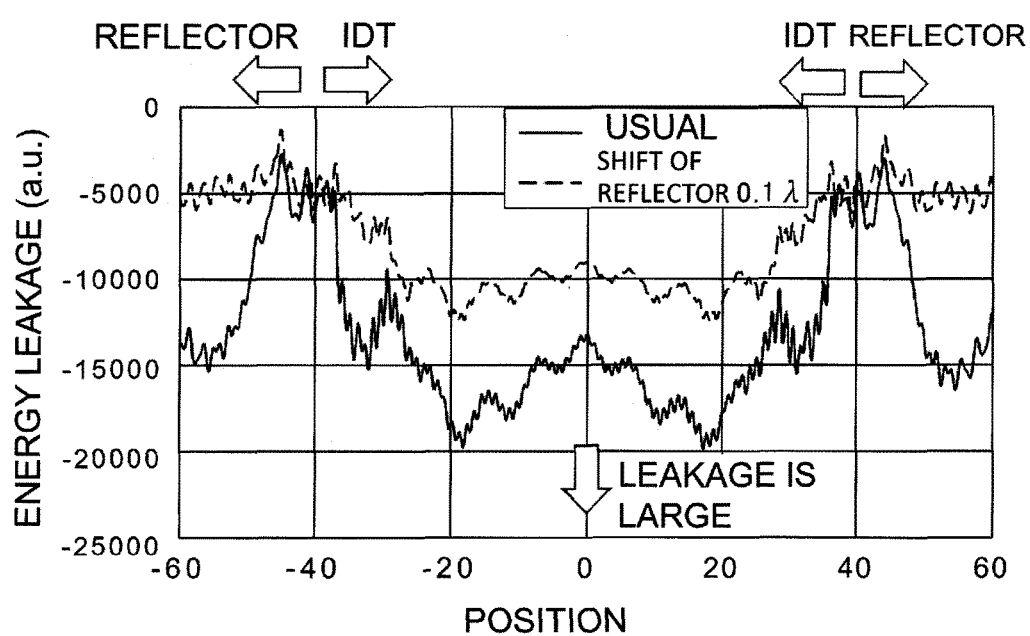
FIG. 7 shows the results of a simulation showing energy leakage in a thickness direction of a piezoelectric substrate of the acoustic wave element changed in the gap G in the case of FIG. 5.

The results are shown in FIG. 7. In FIG. 7, the ordinate shows the amount of energy leakage to the thickness direction of the piezoelectric substrate 2, while the abscissa shows the direction of lineup of the electrode fingers 32 and reflection electrode fingers 42. The larger the minus value at the ordinate, the larger the leakage amount that is shown. The simulation was carried out at a frequency 1% higher than the antiresonance frequency. Further, FIG. 7 shows the energy leakage to the thickness direction of the piezoelectric substrate 2 at the point of a depth of 3λ in the thickness direction from the upper surface 2A of the piezoelectric substrate 2. A solid line shows the amount of leakage in a SAW element which is not provided with a shift part, and a broken line shows the amount of leakage in a SAW element provided with a shift part. Note that, a SAW element which is not provided with a shift part is a usual SAW element. A SAW element provided with a shift part is a SAW element according to the present embodiment.

As shown in FIG. 7, in a usual SAW element, the leakage becomes the maximum at a position about 20 electrode fingers 32 or reflection electrode fingers 42 away from the boundary between the IDT electrode 3 and each reflector 4. This is considered to be because a bulk wave which is emitted due to a discontinuity of the electrode fingers 32 and the reflection electrode fingers 42 in the vicinity of the boundary between the IDT electrode 3 and a reflector 4 obliquely propagates in the thickness direction in the piezoelectric substrate 2 and reaches a position about 20 electrode fingers 32 away from the boundary between the IDT electrode 3 and the reflector 4 at the thickness position of 3λ from the upper surface 2A.

Contrary to this, in the SAW element according to the present embodiment, at both of the IDT electrode 3 side and a reflector 4 side, it can be confirmed that there is less of an amount of leakage energy to the thickness direction of the piezoelectric substrate 2 compared with a usual SAW element. That is, it is seen that the leakage of energy to the thickness direction of the piezoelectric substrate 2 is suppressed.

It is considered from this that the leakage of energy can be suppressed and the loss of the resonator can be suppressed in the SAW element 1 used as a resonator.

Next, the relationship between the amount of shift of a shift part to the IDT electrode 3 side and the characteristics of the resonator will be examined. A model was prepared with the wavelength λ of the acoustic wave set to 2.0 μm. Simulation was carried out with the amount of shift of the shift part set to −0.15λ to 0.05λ. Note that, in FIGS. 8A and 8B, when the shift amount is negative, shift closer to the IDT electrode 3 side is shown, while when positive, shift away from the IDT electrode 3 side is shown. A model where the shift amount is 0λ shows a usual SAW element.

Here, it was confirmed that when the shift amount was changed, the phase characteristic of the SAW element changed in the two frequency regions of the higher frequency side than the resonance frequency and the higher frequency side than the antiresonance frequency. Here, the "higher frequency side than the resonance frequency" designates the frequency band at the center between the resonance frequency and the antiresonance frequency, while the "higher frequency side than the antiresonance frequency" designates the frequency band on a higher frequency side by 1% than the antiresonance frequency.

Figure 8A:
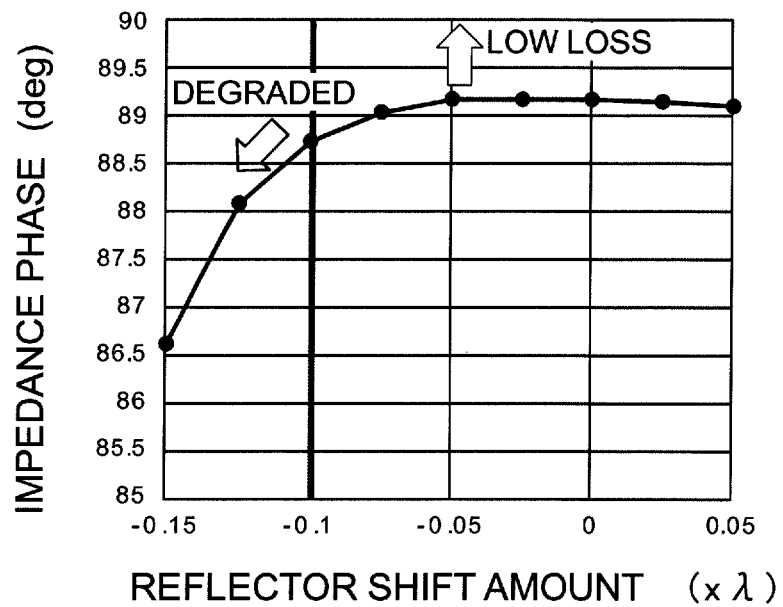
Figure 8B:
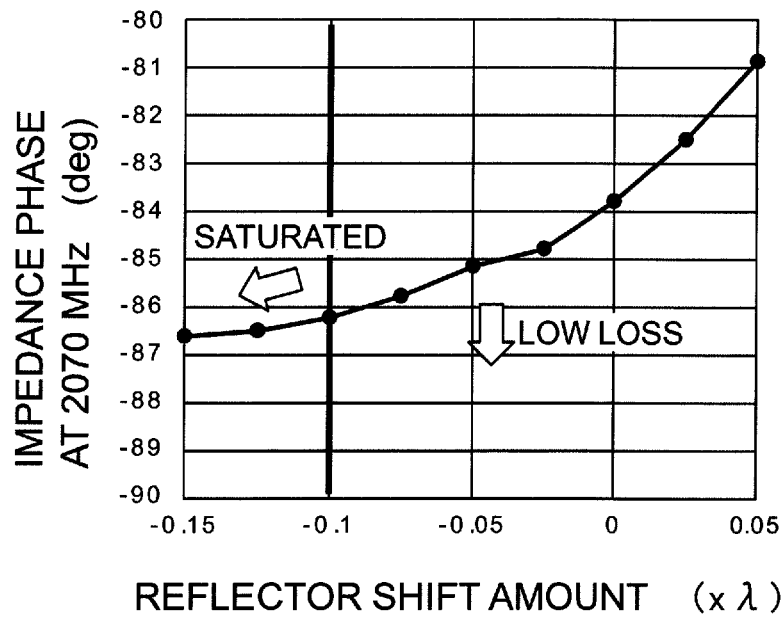

FIGS. 8A and 8B show the changes of the phase characteristics relative to the shift amounts. The phase characteristic on a higher frequency side from the resonance frequency is shown in FIG. 8A, and the phase characteristic on a higher frequency side from the antiresonance frequency is shown in FIG. 8B. In these diagrams, the abscissas show the reflector shift amounts (xλ), and the ordinates show the impedance phases (deg).

In the frequency band between the resonance frequency and the antiresonance frequency, the smaller the loss of the resonator, the more the phase of the impedance approaches 90°. Here, as shown in FIG. 8A, at the higher frequency side than the resonance frequency, when the amount of shift to the IDT electrode 3 side was made larger than 0.1λ, it was confirmed that the phase drastically deteriorated in a direction away from 90°, therefore the loss became large. This frequency band corresponds to the left shoulder of the pass band of the filter (end part on the low frequency side) when using the SAW element as a parallel arm resonator forming a filter. For this reason, in order to suppress the loss at the end part on the low frequency side in the pass band to make the shoulder characteristic better, it is necessary to suppress the shift amount to 0.1λ or less.

Next, on the higher frequency side than the antiresonance frequency, the smaller the loss of the resonator, the more the phase of impedance approaches −90°. Here, as shown in FIG. 8B, at the higher frequency side than the antiresonance frequency, it was confirmed that by shifting the reflector 4 to the IDT electrode 3 side, the phase approached −90°. Note that, it was confirmed that this tendency toward improvement was saturated when the shift amount became larger and exceeded 0.1λ and that further improvement could not be expected. This frequency band on the higher frequency side than the antiresonance frequency corresponds to the right shoulder of the pass band of the filter (end part on the high frequency side) when using the SAW element as a parallel arm resonator forming a filter. For this reason, in order to suppress the loss at the end part on the high frequency side in the pass band to make the shoulder characteristic better, it is necessary to make this approach the IDT electrode 3 side more than 0λ. Note that, if considering deterioration of the left shoulder characteristic of the pass band, the shift amount should be set larger than 0λ and suppressed to 0.1λ or less. In particular, the shoulder characteristics of the filter become good when setting this to 0.025λ to 0.075λ.

(Modification 1 of SAW Element)

In the above explanation, the SAW element 1 was explained for the case where the gap G between the IDT electrode 3 and each reflector 4 was narrowed. However, as shown in FIG. 9, as the method of arranging the reflection electrode fingers 42 closer to the IDT electrode 3 side than the virtual electrode finger positions, the pitch Pt2 of some of the reflection electrode fingers 42 may be narrowed as well.

Specifically, in the reflector 4, a second interval "b" of the interval between the centers of at least two adjoining reflection electrode fingers 42 (first reflection electrode finger 42a and second reflection electrode finger 42b) which are positioned on the IDT electrode 3 side may be narrower than the pitch Pt1 (first interval "a") of the electrode fingers 32 which are positioned in the center vicinity 3a of the IDT electrode 3. It is sufficient that at least two of the reflection electrode fingers 42 be given the pitch Pt2 narrower than the pitch Pt1. However, all of the reflection electrode fingers 42 may be given the pitch Pt2 as well.

Figure 9:
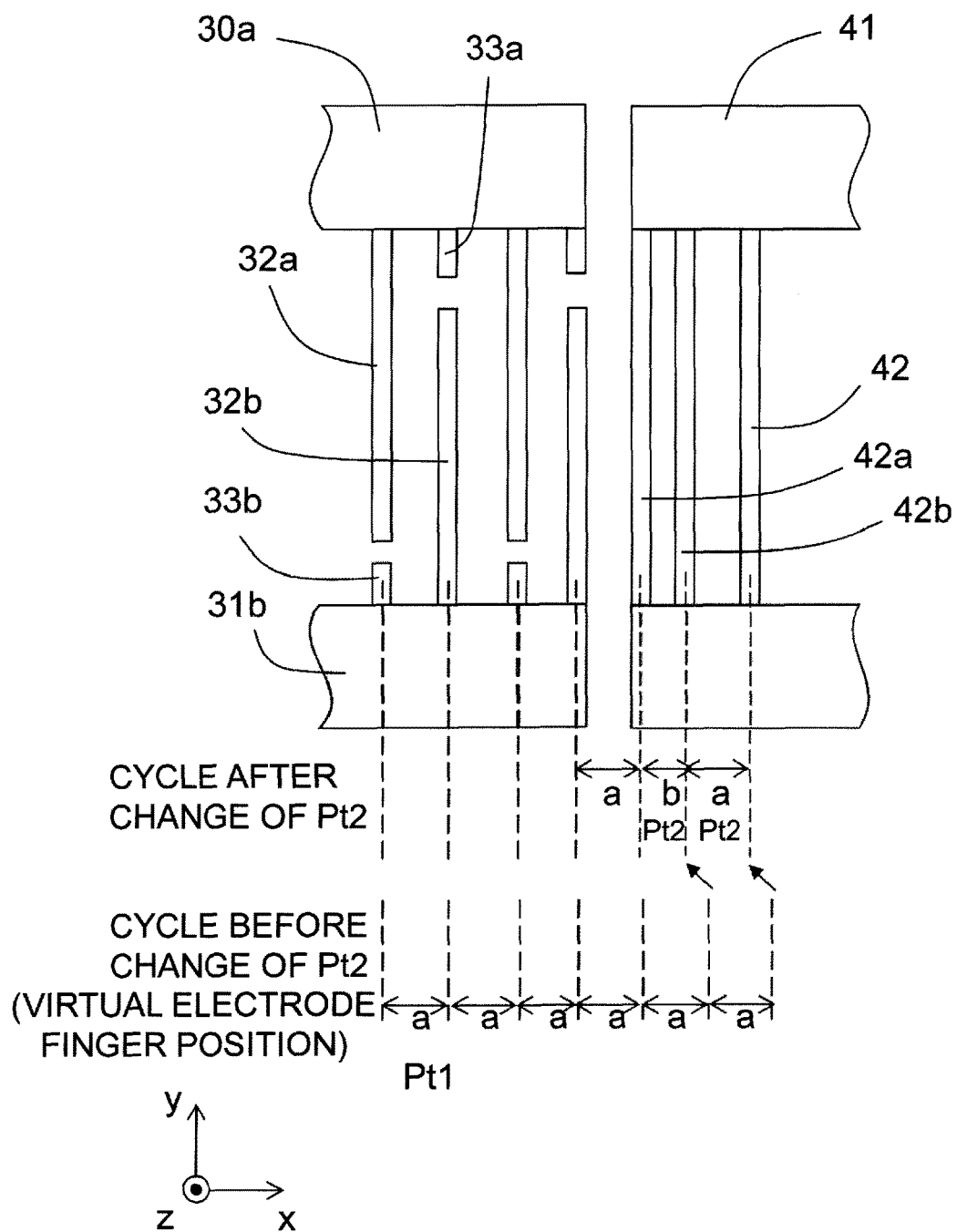
FIG. 9 shows the configuration of an acoustic wave element according to a modification of the present invention and is an enlarged plan view enlarging the portion of the excitation electrode and reflector.

In the example shown in FIG. 9, the pitch between the first reflection electrode finger 42a which is positioned on the IDT electrode 3 side and the second reflection electrode finger 42b which is adjacent to this and is arranged on the opposite side to the IDT electrode 3 with respect to the first reflection electrode finger 42a is defined as the second interval "b". Note that, the first reflection electrode finger 42a is arranged at a virtual electrode finger position. Further, the pitches of the reflection electrode fingers 42 which are positioned further on the opposite side to the IDT electrode 3 than the second reflection electrode finger 42b are made equal to the first interval "a". Due to this, the shift part is formed by the second reflection electrode finger 42b and the reflection electrode finger 42 which is positioned further on the opposite side to the IDT electrode 3 than the second reflection electrode finger 42b. In other words, the shift part is configured by a group of reflection electrode fingers 42 which are positioned further on the opposite side to the IDT electrode 3 than the first reflection electrode finger 42a.

In the reflection electrode fingers 42 given the narrowed pitch Pt2, the pitch Pt2 can be set within a range of for example 0.8 time to 0.975 time the first interval "a". In other words, the distance approaching the excitation electrode 3 side may be set to, for example, 0.025 time to 0.2 time the first interval "a". In still other words, the reflection electrode fingers 42 are shifted the IDT electrode 3 side by a distance of $0.0125\lambda$ to $0.1\lambda$ relative to the virtual electrode finger position.

Further, the present modification shows the case where the pitch Pt2 of the two reflection electrode fingers 42 including the reflection electrode finger 42 positioned in the end part on the IDT electrode 3 side is narrowed. However, not limited to this, the pitches Pt2 of the reflection electrode fingers 42 not at the end part on the IDT electrode 3 side (present at positions away from the IDT electrode 3) may be narrowed as well. Further, all of the reflection electrode fingers 42 may be given narrowed pitches Pt2. However, among the plurality of reflection electrode fingers 42, the pitch Pt2 is prevented from ever becoming larger than the first interval "a".

By narrowing only the pitch Pt2 of part of the reflection electrode fingers 42 as in the present modification, the acoustic wave can be suitably reflected and the deterioration of the characteristics in the vicinity of the resonance point can be reduced while maintaining the effect of improvement of loss in the vicinity of the antiresonance point.

By narrowing the pitch Pt2 of at least part of the reflection electrode fingers 42, as shown in FIG. 9, at least part of the reflection electrode fingers 42 in the reflector 4 can be made closer to the IDT electrode 3 side than the usual pitch (virtual electrode finger position). As a result, the same effects as those in the case explained above where the gap G between the IDT electrode 3 and each reflector 4 is narrowed can be obtained. In addition, since the pitch Pt2 of the reflection electrode fingers 42 is narrowed, the gap G between the IDT electrode 3 and each reflector 4 does not become narrower, therefore deterioration of the electrostatic discharge resistance and electric power resistance can be made less likely.

Next, samples of the SAW element were prepared and evaluated for their impedance characteristics for the case of narrowing the pitches Pt2 of part of the reflection electrode fingers 42 like in the SAW element 1 of the present modification. The fundamental configuration of the samples is the same as that in the embodiment explained above. The SAW element 1 in the present modification is the case where the pitches Pt2 of the two reflection electrode fingers 42 on the IDT electrode 3 side are set to 1.0 time and 0.9 time the first interval "a". Note that, a case where the pitch Pt2 is 1.0 time the first interval "a" is the case of a usual SAW element.

Figure 10A:
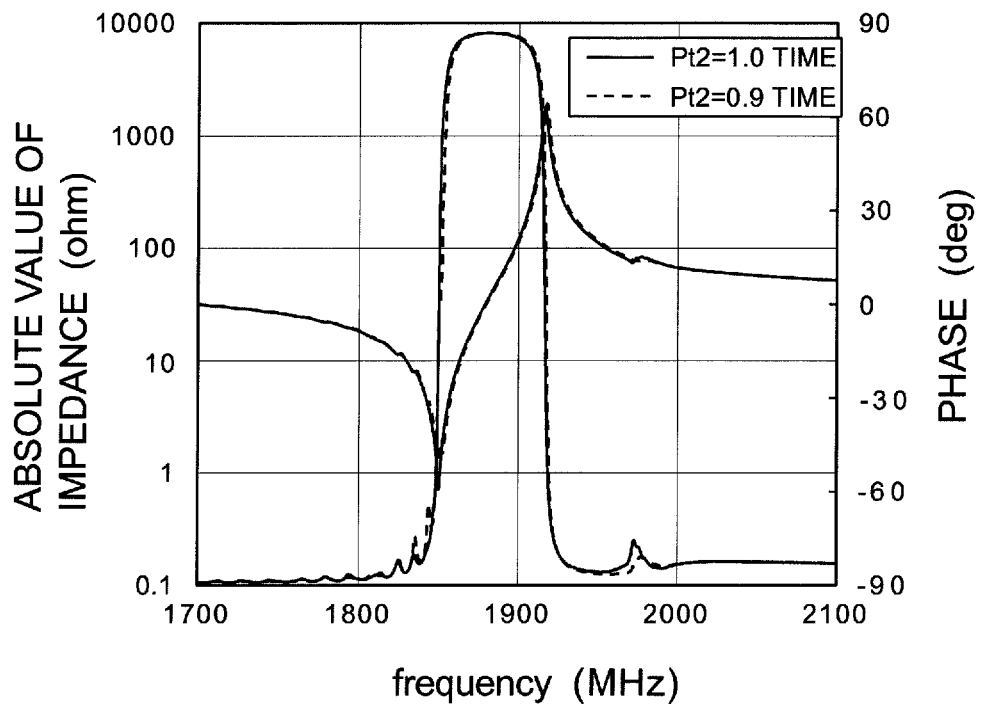
FIG. 10A shows the results of measurement of the impedance characteristic of an acoustic wave element changed in a pitch Pt2 of the reflection electrode fingers in the case of FIG. 9, and FIG. 10B enlarges a portion in FIG. 10A.
Figure 10B:
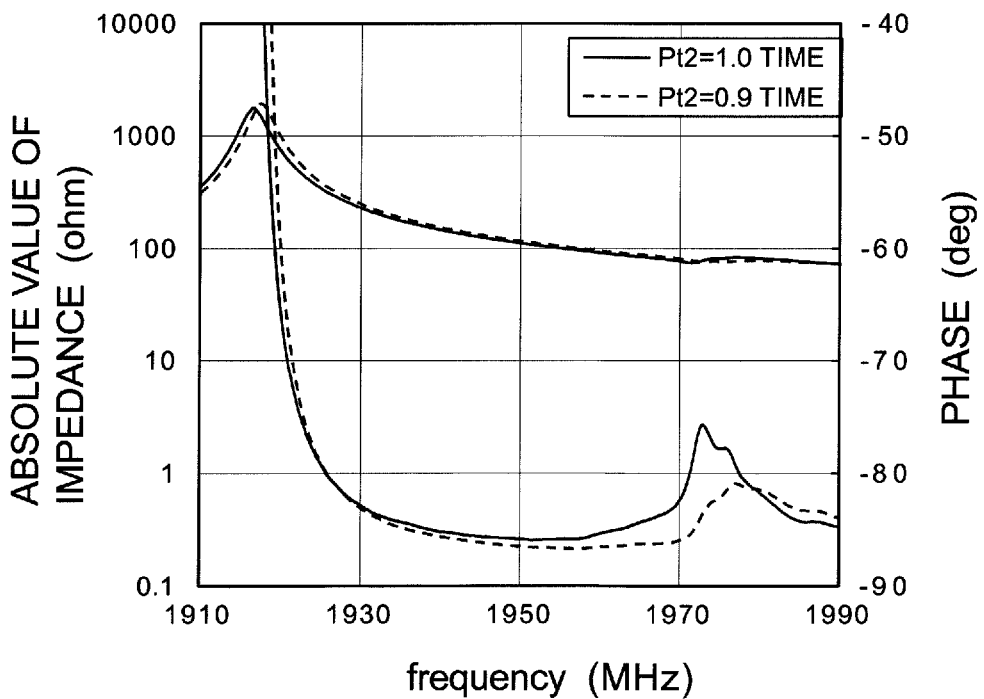

The results of measurement of the prepared samples will be shown in FIGS. 10A and 10B. In FIGS. 10A and 10B, the abscissas show the frequencies (MHz), the left ordinates show the absolute values of impedance (ohm), and the right ordinates show the phases of impedance (deg). The solid lines in the graphs show the characteristics of a usual SAW element, and the broken lines show the characteristics of the SAW element 1 in the present modification. As apparent also from the results shown in these graphs, it could be confirmed that, in the SAW element 1 in the modification, compared with the usual SAW element, the phase approached −90° in the region on the higher frequency side than the antiresonance frequency. It is seen from this result that the effect of suppressing loss of the resonator could be obtained in the same way as the case where the gap G is narrowed as in the embodiment explained above.

Further, samples of the SAW element were prepared in order to examine the loss suppression effect at the time when the place for narrowing the pitch Pt2 of part of the reflection electrode fingers 42 in the reflector 4 is made different. Specifically, samples of the SAW element of Models 1 to 9 were prepared and were evaluated for the phase characteristics of the impedance. Model 1 is the usual SAW element, Model 2 is a SAW element where the gap G between the IDT electrode 3 and each reflector 4 is set to $0.9\lambda$, and Models 3 to 9 are SAW elements at the time when the interval of the reflection electrode fingers 42 is set to the second interval "b". In Models 3 to 9, the position of the portion in which the interval of the two reflection electrode fingers 42 is set to the second interval "b" (narrow pitch portion) is made different; Model 3 is the type in which this position is set between the reflection electrode finger 42 which is positioned in the end part on the excitation electrode 3 side and the first finger from the end part; Model 4 is the type in which the position is set between the first finger and the second finger from the end part; in this way, the positions are shifted in order, and Model 9 is the type in which the position is set between the sixth finger and the seventh finger. In these examples, the reflection electrode finger 42 which is positioned in the end part on the IDT electrode 3 side becomes the 0-th one. Note that, the intervals between the reflection electrode fingers 42 were set to the first interval "a" except for the spot having the second interval "b". The second interval "b" was set to $0.9\lambda$.

For such Models 1 to 9, the phases in the frequency band at a 1% higher frequency side than the antiresonance frequency were measured. The results will be shown in FIG. 11.

Figure 11:
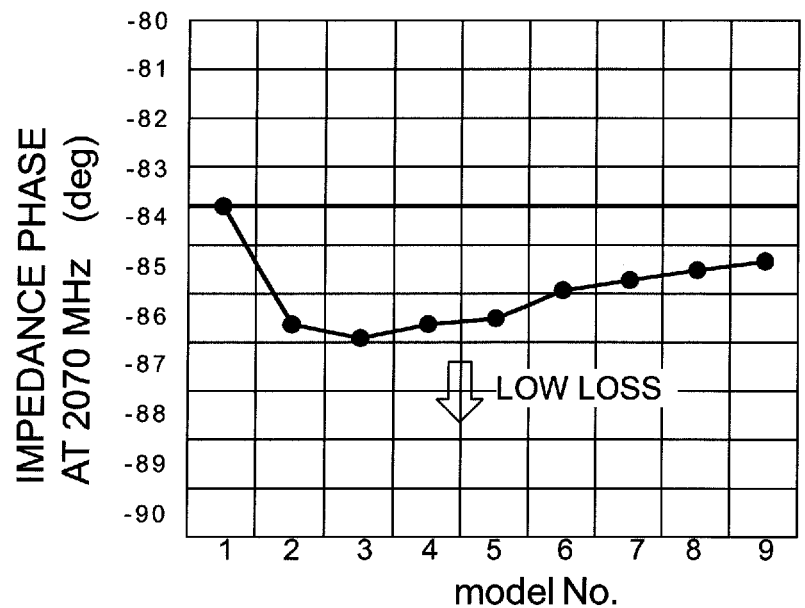
FIG. 11 is a graph for comparing the phase of the impedance characteristics of an acoustic wave element changed in the spot where the pitch Pt2 of the reflection electrode fingers is to be changed in the case of FIG. 7.
Figure 11:
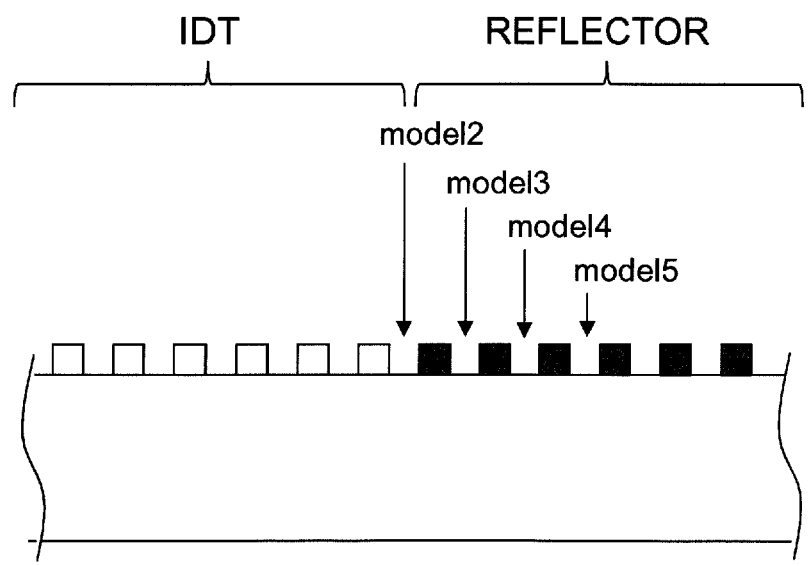

In FIG. 11, the phase characteristic values of Models 1 to 9 on a higher frequency side than the antiresonance frequency are plotted. In the graph, the abscissa shows the numbers of the models (No.), and the ordinate shows the impedance phases (deg) at 2070 MHz. Because of being at the higher frequency side than the antiresonance frequency, the loss as a resonator becomes smaller as the phase approaches −90°.

As apparent also from the results shown in FIG. 11, by providing the narrow pitch portion, the phase characteristics on the higher frequency side than the antiresonance frequency are improved. In particular, in Model 3 (configuration shown in FIG. 7), it was confirmed that the phase characteristics were more excellent than the case where the gap G between the IDT electrode 3 and each reflector 4 was adjusted (Model 2). Further, the effect of improvement of the phase characteristics becomes smaller as the narrow pitch portion becomes further from the IDT electrode 3. However, the phase characteristics have been sufficiently improved up to between the sixth finger and the seventh finger from the reflection electrode finger 42 which is positioned in the end part on the IDT electrode 3 side. Therefore, it could be confirmed that the SAW element was provided with a loss improvement characteristic as a resonator.

(Modification 2 of SAW Element)

Figure 12:
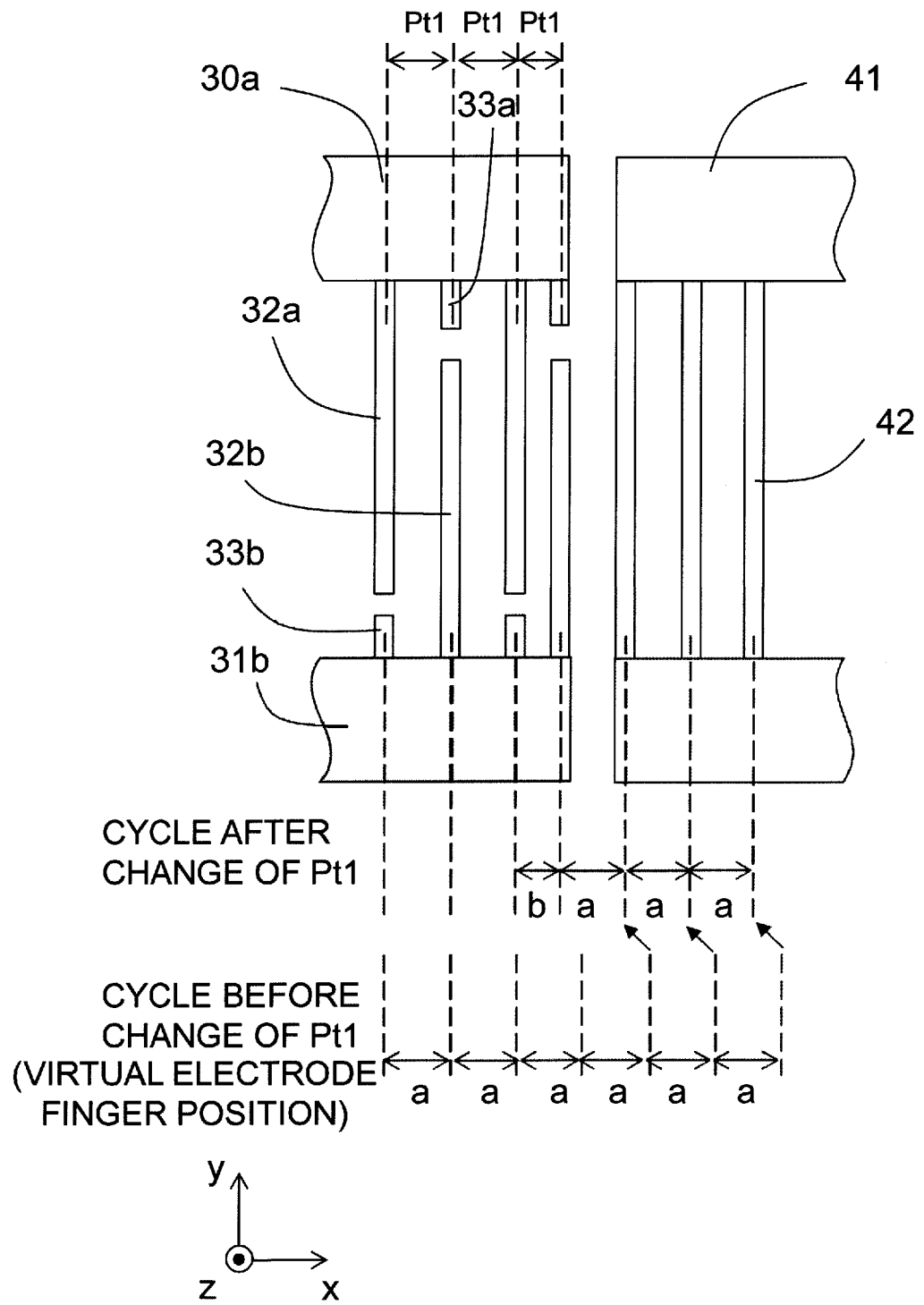
FIG. 12 shows the configuration of an acoustic wave element according to a modification of an embodiment of the present invention and is an enlarged plan view enlarging the portion of the excitation electrode and reflector.

Further, in the SAW element 1, as the method of arranging the reflection electrode fingers 42 closer to the IDT electrode 3 side than the pitch of the plurality of electrode fingers 32 configuring the IDT electrode 3, as shown in FIG. 12, the pitch Pt1 of the electrode fingers 32 in the IDT electrode 3 may be made narrowed as well.

Specifically, in the IDT electrode 3, the pitch Pt1 of at least the two adjoining electrode fingers 32 which are positioned on a reflector 4 side may be made narrower than the first interval "a" of the electrode fingers 32 which are positioned in the center vicinity 3a of the center of the IDT electrode 3 as well. There need only be at least two electrode fingers given the narrowed pitch Pt1 in the IDT electrode 3. The present modification is the case of narrowing the pitch Pt1 of two electrode fingers 32 which include the electrode finger 32 positioned in the end part of the IDT electrode 3 on a reflector 4 side. However, not limited to this, the pitch Pt1 of electrode fingers 32 which are away from the end part may be narrowed as well.

By narrowing the pitch Pt1 of the electrode fingers 32 in this way, as shown in FIG. 12, the reflection electrode fingers 42 in a reflector 4 can made closer to the IDT electrode 3 side than the usual pitch. As a result, the same effects as those in the case where the gap G between the IDT electrode 3 and each reflector 4 is narrowed as explained above can be obtained.

Figure 13A:
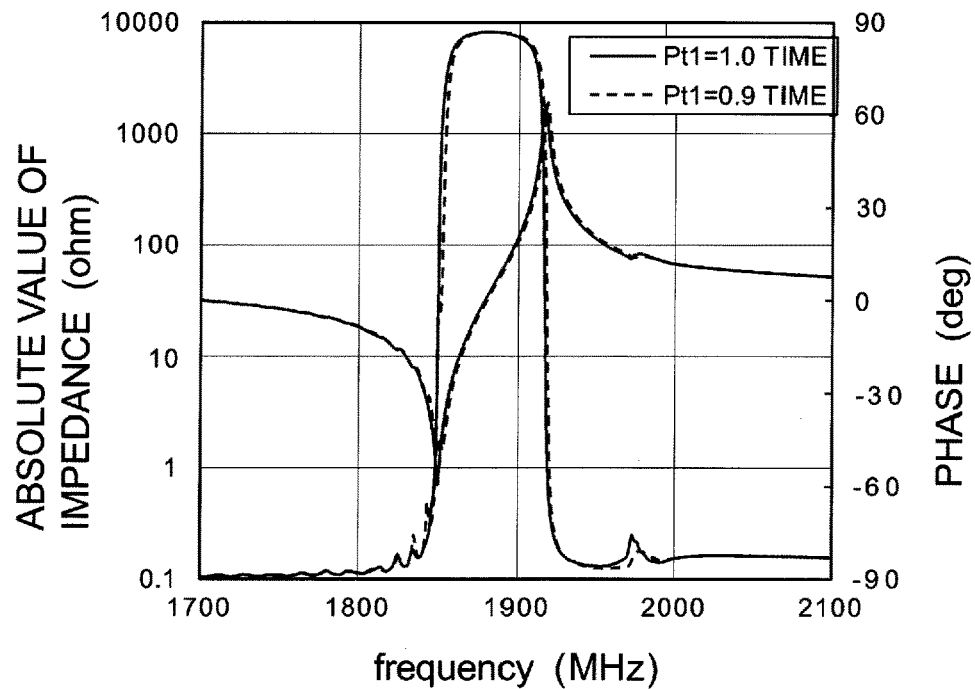
FIG. 13A shows the results of measurement of the impedance characteristic of an acoustic wave element changed in the pitch Pt1 of electrode fingers in the case of FIG. 12, and FIG. 13B enlarges a portion in FIG. 13A.
Figure 13B:
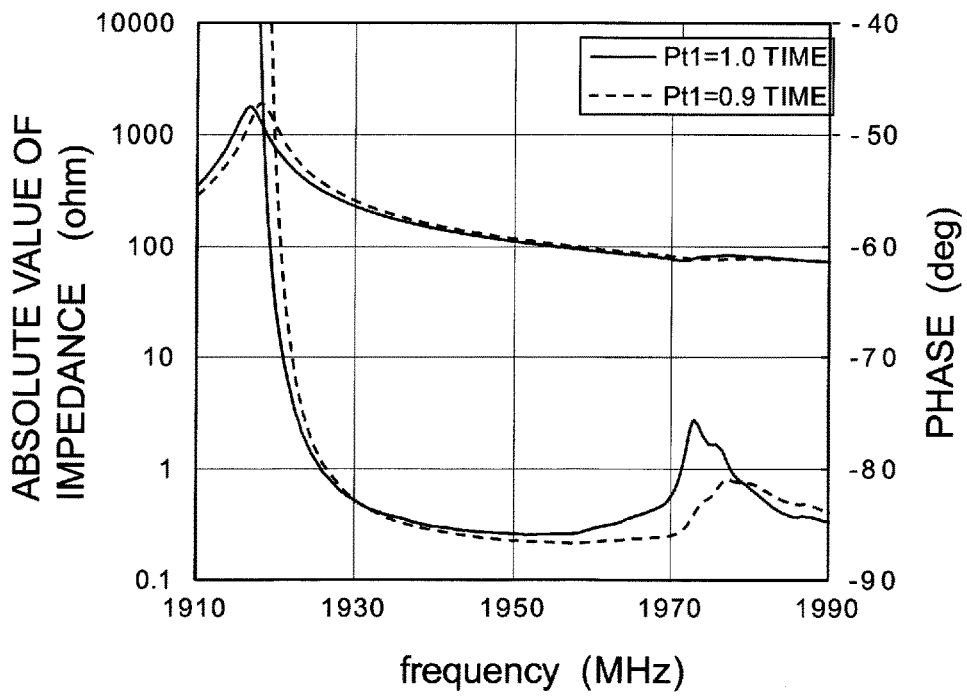

Samples were prepared and were evaluated for their impedance characteristics for the case of narrowing the pitch Pt1 in the IDT electrode 3 like in the SAW element 1 of the present modification. The fundamental configuration of the samples is the same as that in the embodiment explained above. The SAW element 1 in the present modification is the case where the pitch Pt1 of the two electrode fingers 32 in the IDT electrode 3 which are on the reflector 4 side is set to 0.9 time the pitch Pt1 in the center vicinity 3a of the IDT electrode 3. That is, the interval of the two electrode fingers 32 in the IDT electrode 3 on the reflector 4 side is set to 0.9. The results of measurement for the prepared samples will be shown in FIGS. 13A and 13B. In FIGS. 13A and 13B, the abscissas show the frequencies (MHz), the left ordinates show the absolute values of impedance (ohm), and the right ordinates show the phases (deg). The solid lines show the characteristics of the usual SAW element, and the broken lines shows the characteristics of the SAW element in the present modification. As shown in FIG. 13B, on the higher frequency side than the antiresonance frequency, the phase in the SAW element 1 of the modification approached −90° more than the usual SAW element, therefore it could be confirmed that the loss as the resonator could be suppressed. It is seen from this result that the SAW element 1 in the present modification could obtain the same effects as those by the case where the gap G was narrowed as in the embodiment explained above.

<Filter Element and Communication Device>

Figure 14:
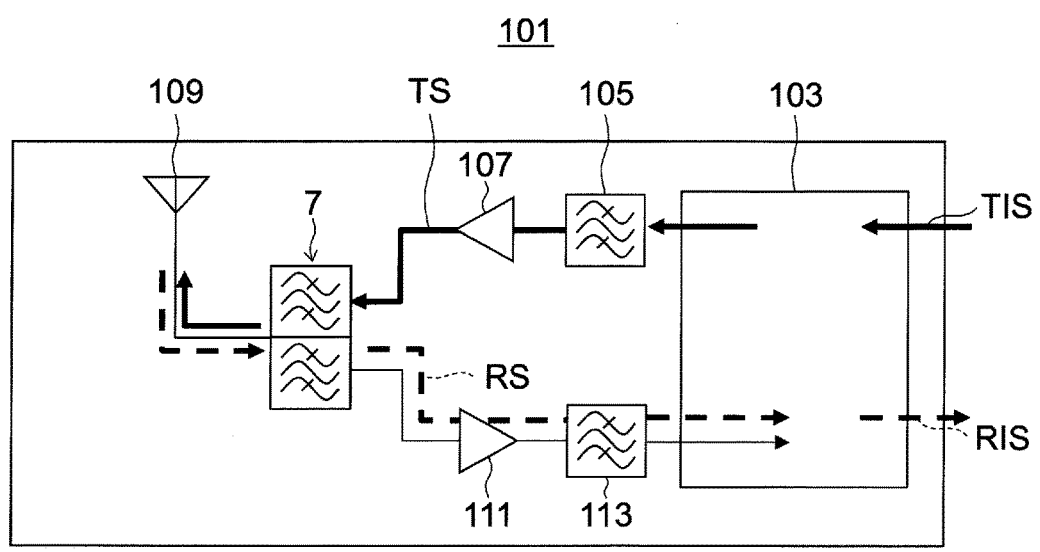
FIG. 14 is a view for schematically explaining a communication device according to an embodiment of the present invention.

FIG. 14 is a block diagram showing principal parts of a communication device 101 according to an embodiment of the present invention. The communication device 101 is for performing wireless communications utilizing radio waves. The duplexer 7 has a function of branching a signal having the transmission frequency and a signal having a receiving frequency in the communication device 101.

In the communication device 101, the transmission information signal TIS containing the information to be transmitted is modulated and raised in frequency (converted to high frequency signal of carrier frequency) by the RF-IC 103 to obtain the transmission signal TS. The transmission signal TS is stripped of unnecessary components other than the transmission-use pass band by the bandpass filter 105, is amplified by an amplifier 107, and is input to the duplexer 7. The amplified transmission signal TS sometimes contains noise since it passes through the amplifier 107. The duplexer 7 strips the unnecessary components (noise etc.) other than the transmission-use pass band from the input transmission signal TS and outputs the result to the antenna 109. The antenna 109 converts the input electrical signal (transmission signal TS) to a radio signal which it then transmits.

In the communication device 101, the radio signal received by the antenna 109 is converted to an electrical signal (reception signal RS) by the antenna 109 and is input to the duplexer 7. The duplexer 7 strips the unnecessary components other than the reception-use pass band from the input reception signal RS and outputs the result to the amplifier 111. The output reception signal RS is amplified by the amplifier 111 and is stripped of unnecessary components other than the reception-use pass band by the band pass filter 113. As the unnecessary components removed away by the bandpass filter 113, for example, there can be mentioned noise which is mixed in by the amplifier 111. Further, the reception signal RS is lowered in frequency and demodulated by the RF-IC103 to obtain the receiving information signal RIS.

The transmission information signal TIS and receiving information signal RIS may be low frequency signals (baseband signals) containing suitable information. For example, they are analog audio signals or digital audio signals. The pass band of the radio signal may be one according to various standards such as UMTS (Universal Mobile Telecommunications System). The modulation scheme may be any of phase modulation, amplitude modulation, frequency modulation, or a combination of any two or more among them. Further, the functions of the bandpass filter 105 and bandpass filter 113 may be imparted to the RF-IC 103, and these filters omitted.

Figure 15:
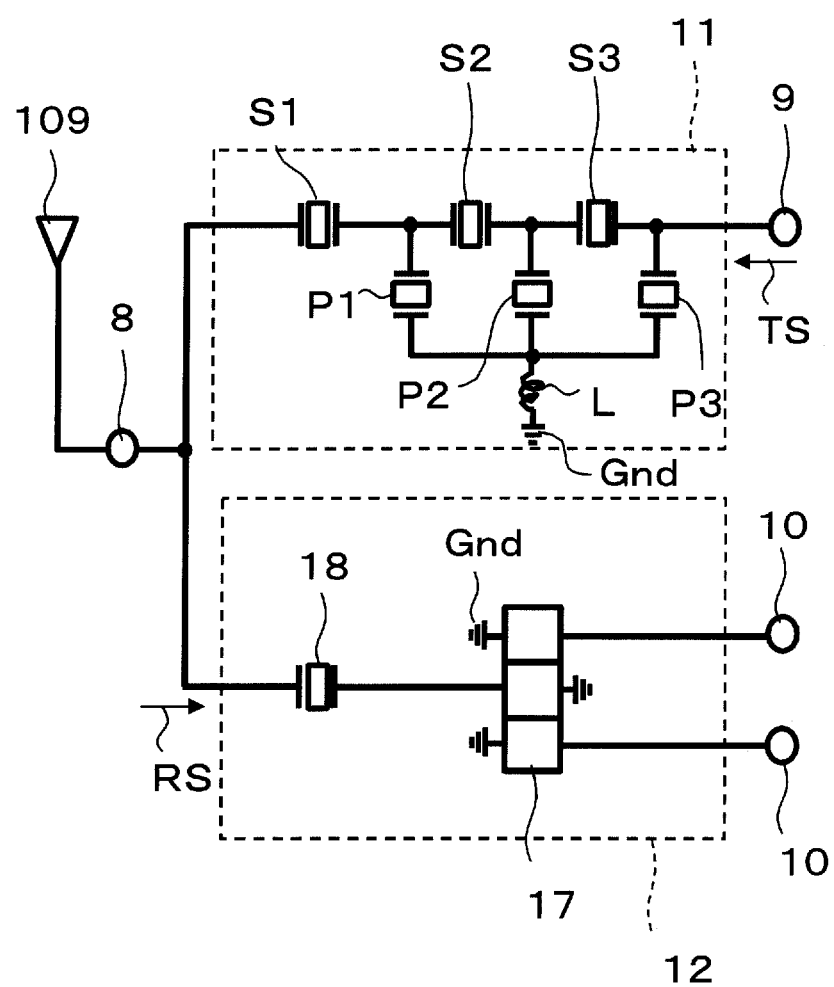
FIG. 15 is a circuit diagram for explaining a dueplexer according to an embodiment of the present invention.

FIG. 15 is a circuit diagram showing the configuration of the duplexer 7 according to an embodiment of the present invention. The duplexer 7 is a duplexer used in the communication device 101 in FIG. 14. The duplexer 7 has a filter element which configures at least one of the transmission filter 11 or receiving filter 12. The filter element configuring at least one of the transmission filter 11 or receiving filter 12 includes a series arm resonator and parallel arm resonator. Use is made of the SAW element 1 as the parallel resonator. The series arm resonator and the parallel arm resonator share the piezoelectric substrate 2 with the SAW element 1.

The SAW element 1 is for example a SAW element which configures part of the ladder type filter circuit of the transmission filter 11 in the duplexer 7 shown in FIG. 14. The transmission filter 11, as shown in FIG. 15, has a piezoelectric substrate 2 and series arm resonators S1 to S3 and parallel arm resonators P1 to P3 which are formed on the piezoelectric substrate 2.

The duplexer 7 is mainly configured by an antenna terminal 8, transmission terminal 9, reception terminals 10, a transmission filter 11 which is arranged between the antenna terminal 8 and the transmission terminal 9, and a receiving filter 12 which is arranged between the antenna terminal 8 and the reception terminals 10.

The transmission terminal receives as input the transmission signal TS from the amplifier 107. The transmission signal TS input to the transmission terminal 9 is stripped of unnecessary components other than the transmission-use pass band in the transmission filter 11 and is output to the antenna terminal 8. Further, the antenna terminal 8 receives as input the reception signal RS from the antenna 109. This is stripped of unnecessary components other than the reception-use pass band in the receiving filter 12 and is output to the reception terminals 10.

The transmission filter 11 is for example configured by a ladder type SAW filter. Specifically, the transmission filter 11 has three series arm resonators S1, S2, and S3 which are serially connected between the input side and output side of the transmission filter 11, and three parallel arm resonators P1, P2, and P3 which are provided between a series arm serving as a line for connecting the series arm resonators S1, S2, and S3 to each other and the reference potential part Gnd. That is, the transmission filter 11 is a ladder type filter having a three-stage configuration. However, in the transmission filter 11, the number of stages of the ladder type filter may be any number. Further, in the transmission filter 11, the transmission terminal 9 functions as the input terminal, and the antenna terminal 8 functions as the output terminal. Note that, when the receiving filter 12 is configured by a ladder type filter, the antenna terminal 8 functions as the input terminal, and the reception terminals 10 function as the output terminals.

Between the parallel arm resonators P1, P2, or P3 and the reference potential part Gnd, sometimes an inductor L is provided. By setting the inductance of this inductor L to a predetermined magnitude, an attenuation pole is formed out of the band of the passage frequency of the transmission signal to make the out-band attenuation larger. The plurality of series arm resonators S1, S2, and S3 and plurality of parallel arm resonators P1, P2, and P3 are respectively configured by SAW resonators like the SAW element 1.

The receiving filter 12 has for example a multi-mode type SAW filter 17 and an auxiliary resonator 18 which is connected in series on the input side of the multi-mode type SAW filter 17. Note that, in the present embodiment, the multiplex mode includes a double mode. The multi-mode type SAW filter 17 has a balanced-unbalanced conversion function, while the receiving filter 12 is connected to the two reception terminals 10 from which the balanced signals are output. The receiving filter 12 is not limited to one configured by a multi-mode type SAW filter 17 and may be configured by a ladder type filter or may be a filter without a balanced-unbalanced conversion function.

Between the connecting point of the transmission filter 11, receiving filter 12, and antenna terminal 8 and the ground potential part Gnd, an impedance matching-use circuit configured by an inductor etc. may be inserted as well.

The SAW element 1 in the present embodiment may be used in any of the parallel arm resonators P1, P2, and P3 as well. By using the SAW element 1 for at least one of the parallel arm resonators P1 to P3, the loss of the pass band of the filter in the vicinity of the end part on the high frequency side can be reduced. In the duplexer 7, the transmission band is positioned on the lower frequency side than the receiving band in many cases. Therefore, particularly in the transmission filter 11, a sharp attenuation characteristic becomes necessary on the high frequency side of the pass band. For this reason, by using the SAW element 1 for the parallel arm resonators P1 to P3, the sharpness can be improved at the same time of reducing the loss of the pass band in the vicinity of the high frequency side. Therefore, in the duplexer 7, the degree of separation of the transmission signal and the reception signal can be improved while making the loss small.

Figure 16:
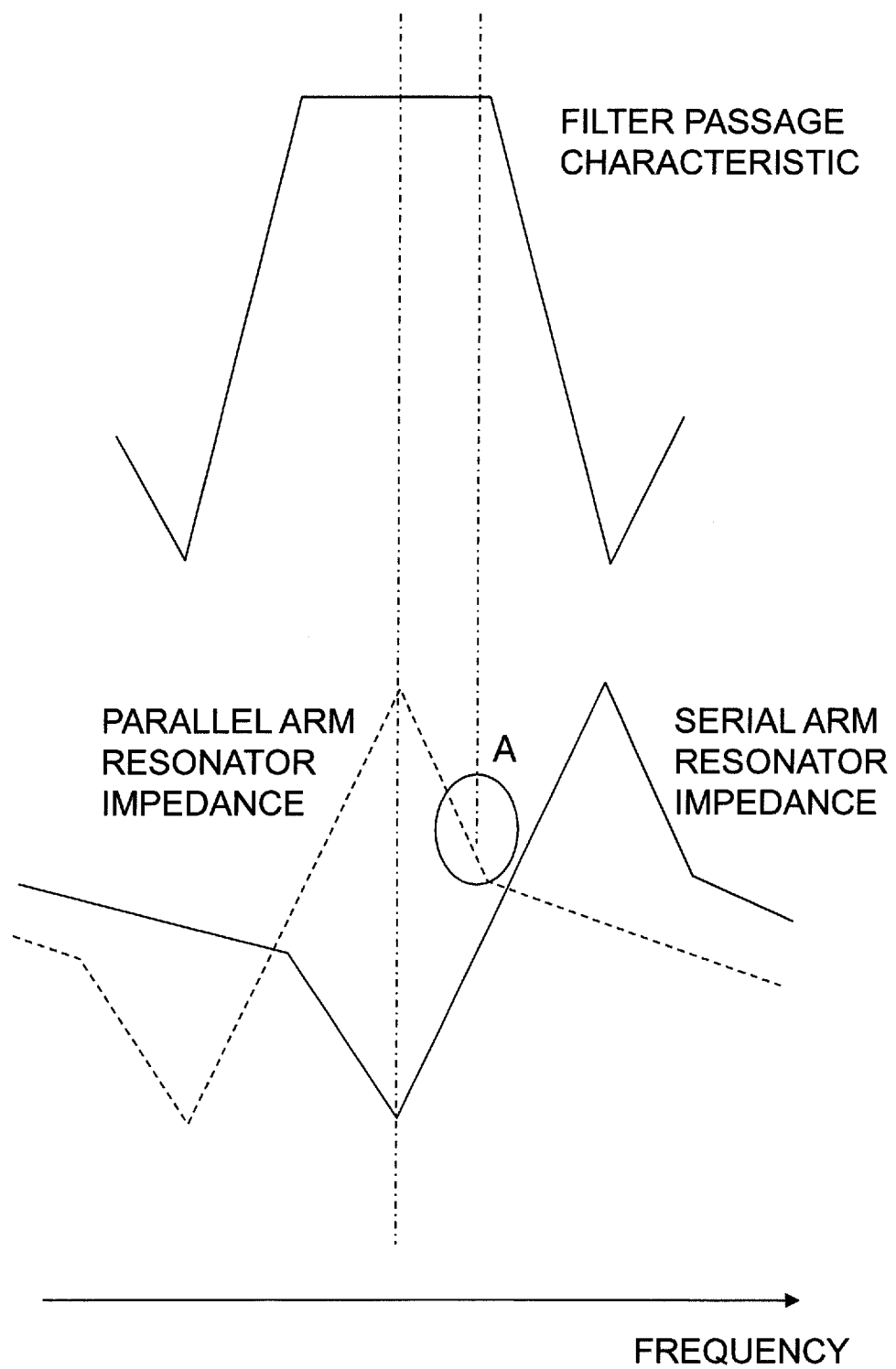
FIG. 16 is a conceptual view showing the relationships among the filter characteristic, series arm resonator, and parallel arm resonator in the dueplexer according to an embodiment of the present invention.
Figure 17A:
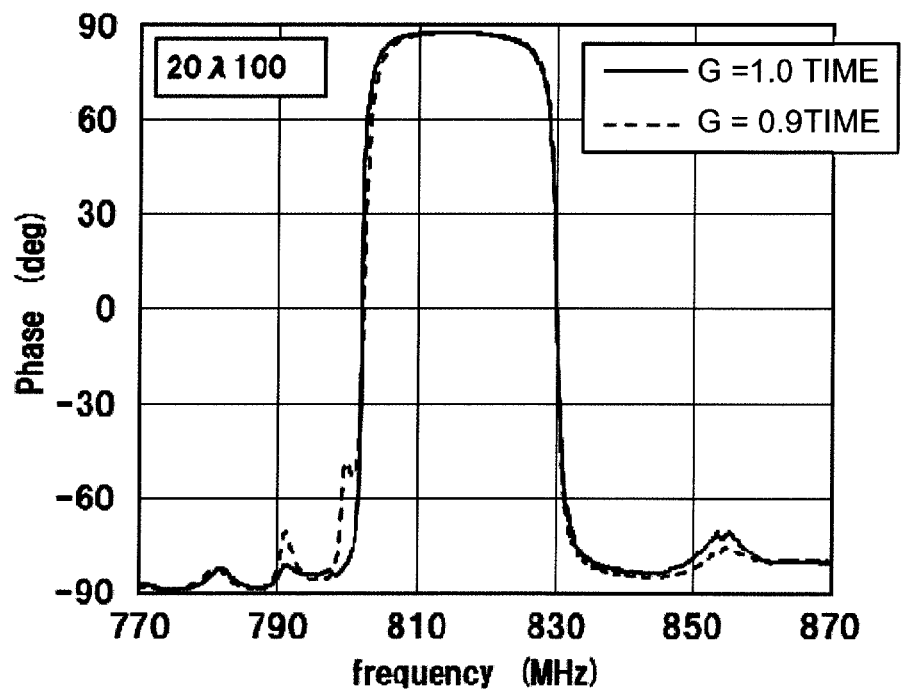
FIG. 17A shows the results of measurement of the impedance characteristic of an acoustic wave element according to a modification of an embodiment of the present invention, and FIG. 17B enlarges a portion in FIG. 17A.
Figure 17B:
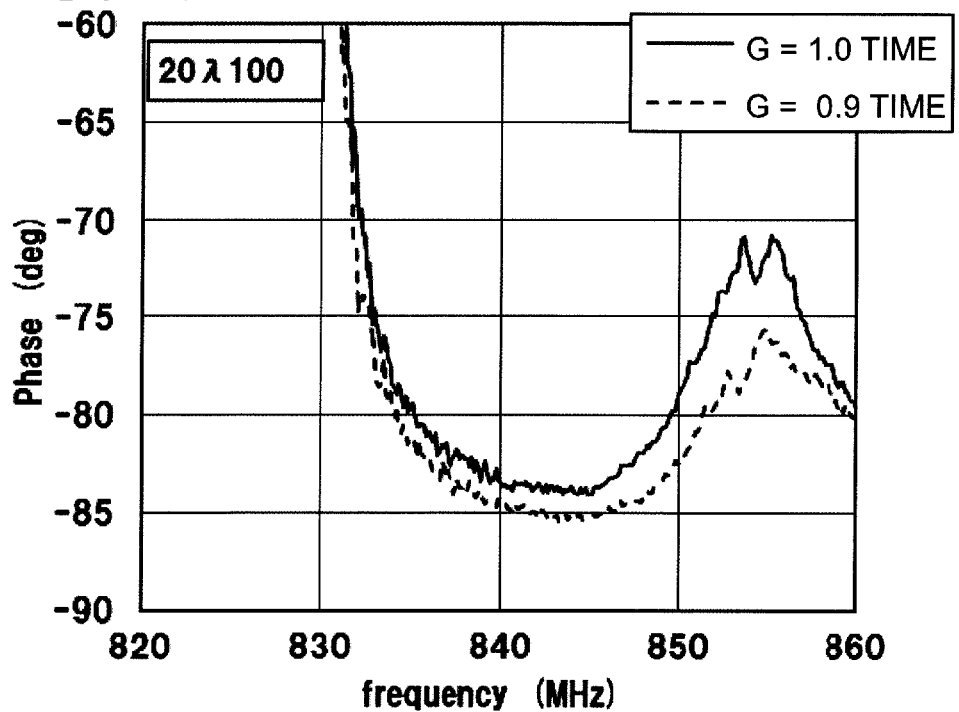
Figure 18A:
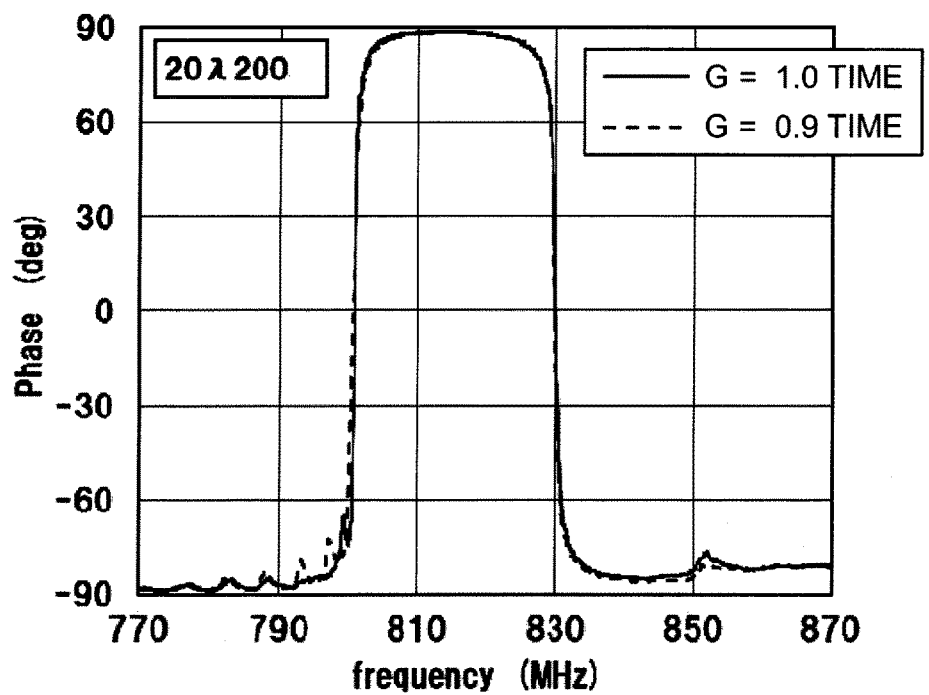
FIG. 18A shows the results of measurement of the impedance characteristic of an acoustic wave element according to a modification of an embodiment of the present invention, and FIG. 18B enlarges a portion in FIG. 18A.
Figure 18B:
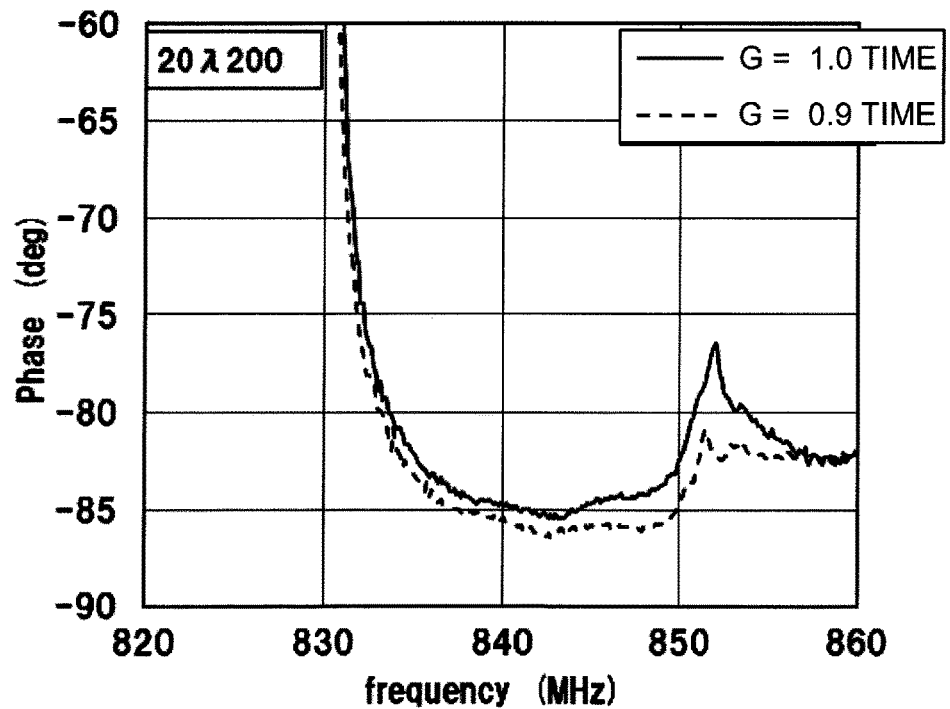
Figure 19A:
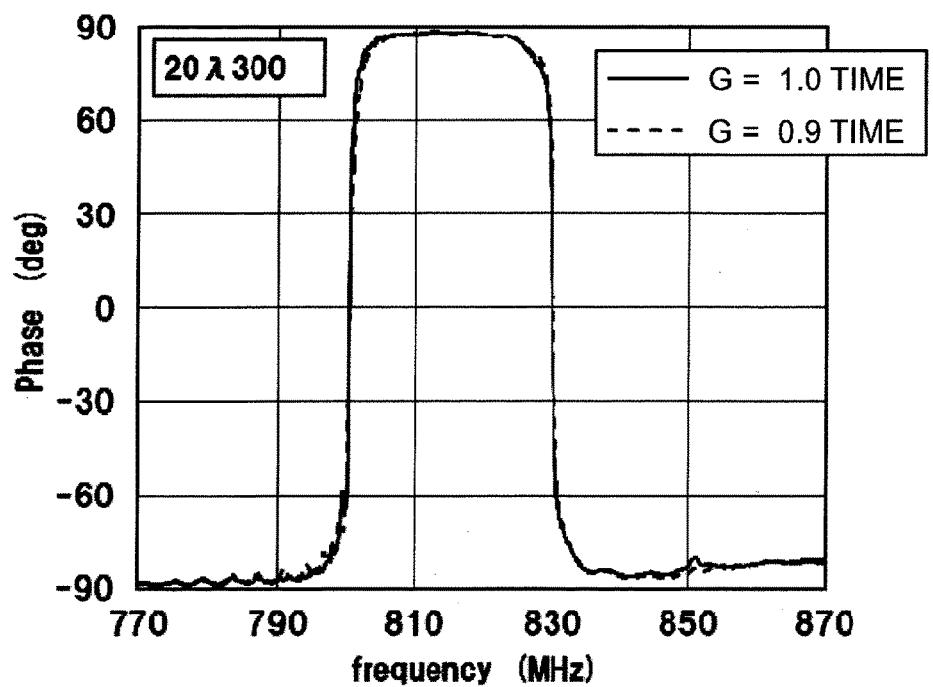
FIG. 19A shows the results of measurement of the impedance characteristic of an acoustic wave element according to a modification of an embodiment of the present invention, and FIG. 19B enlarges a portion in FIG. 19A.
Figure 19B:
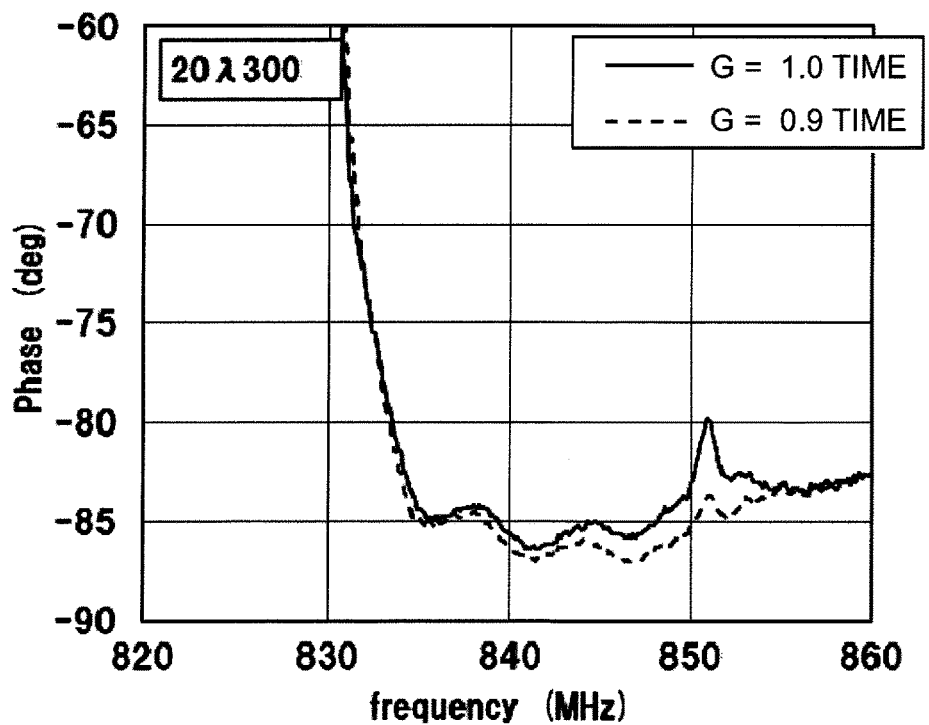
Figure 20A:
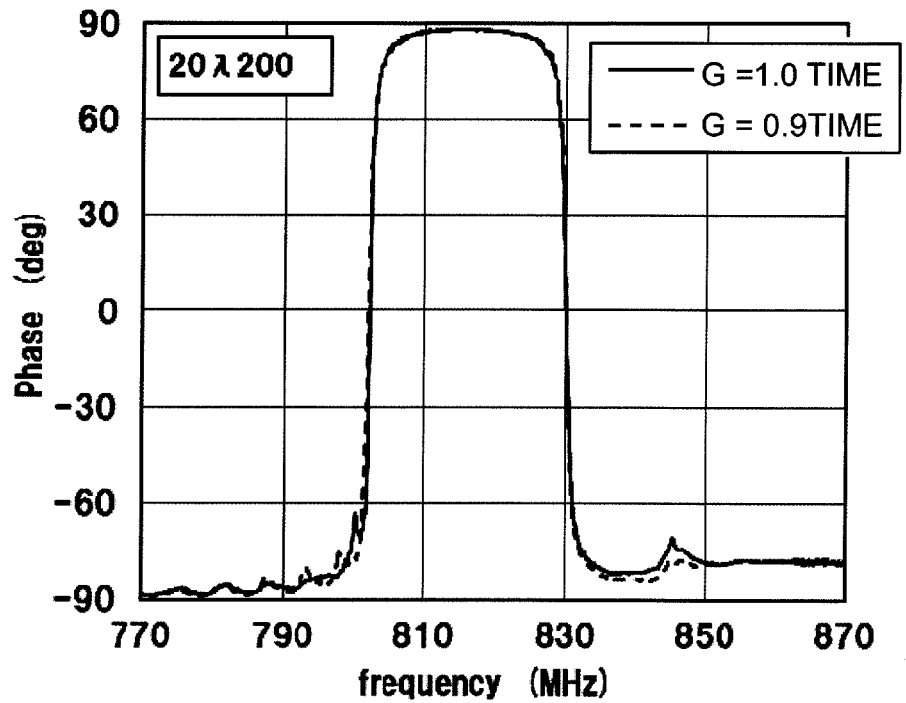
FIG. 20A shows the results of measurement of the impedance characteristic of an acoustic wave element according to a modification of an embodiment of the present invention, and FIG. 20B enlarges a portion in FIG. 20A.
Figure 20B:
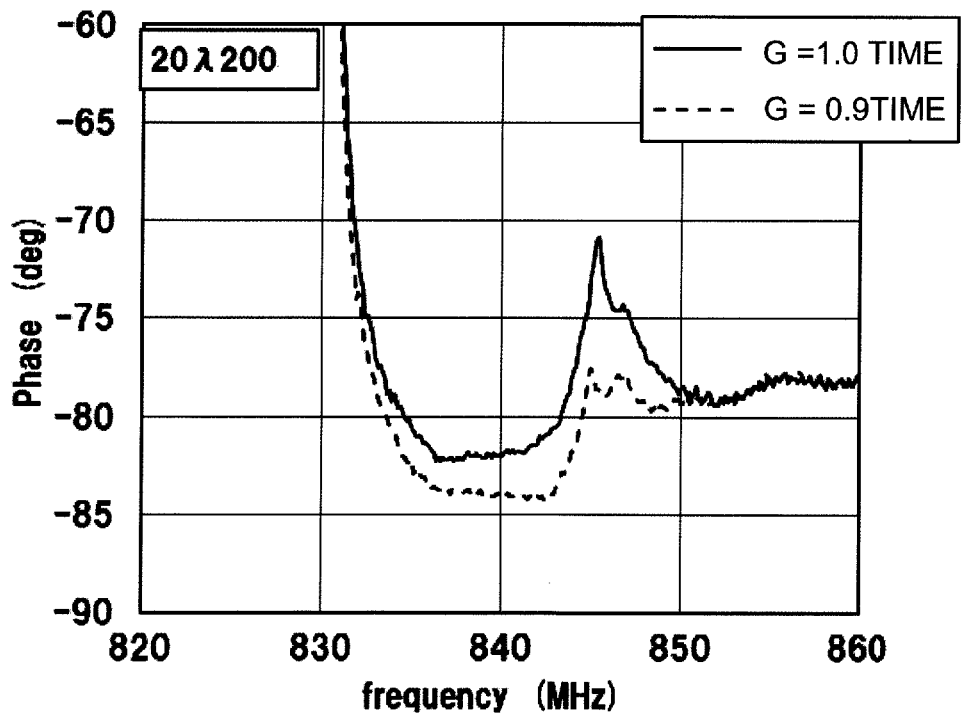
Figure 21A:
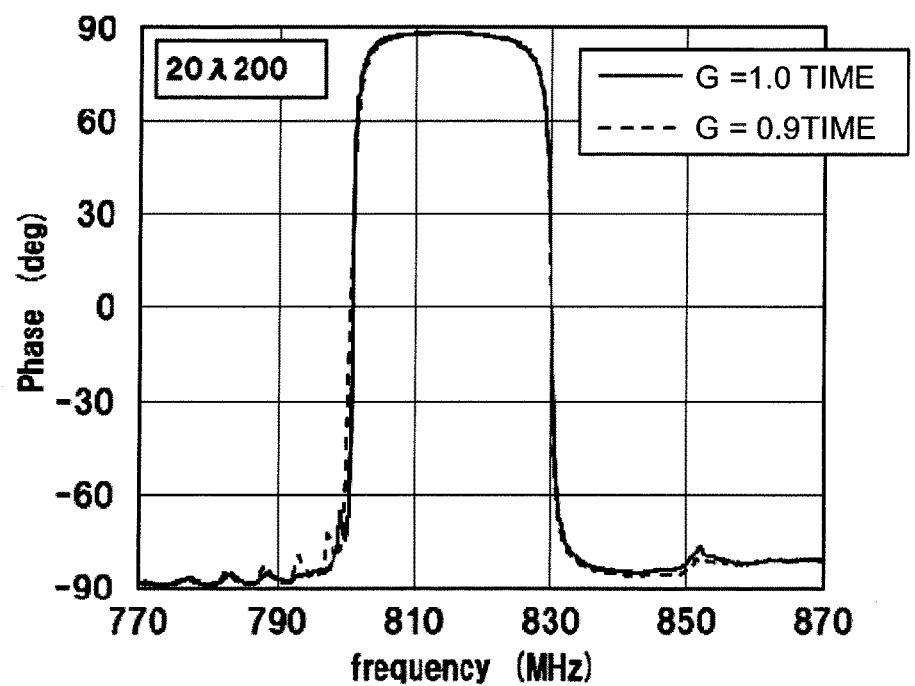
FIG. 21A shows the results of measurement of the impedance characteristic of an acoustic wave element according to a modification of an embodiment of the present invention, and FIG. 21B enlarges a portion in FIG. 21A.
Figure 21B:
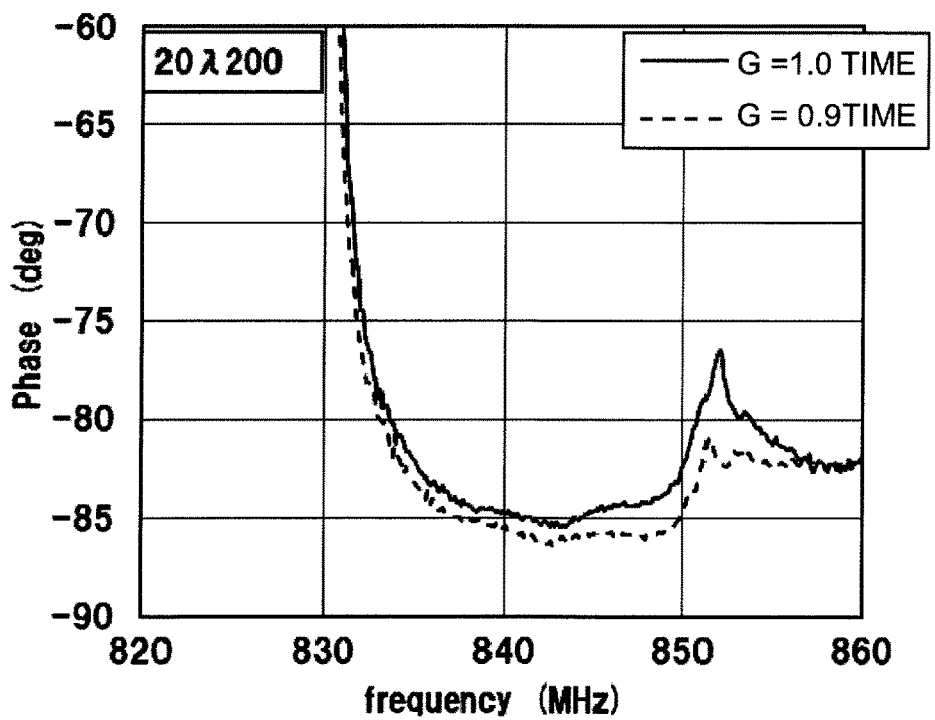
Figure 22A:
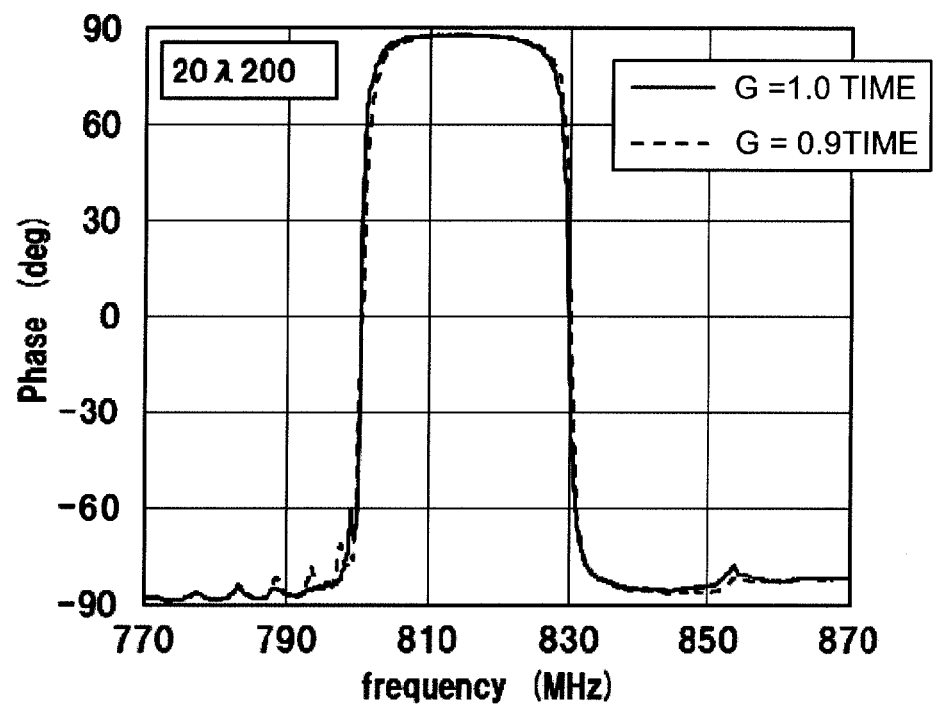
FIG. 22A shows the results of measurement of the impedance characteristic of an acoustic wave element according to a modification of an embodiment of the present invention, and FIG. 22B enlarges a portion in FIG. 22A.
Figure 22B:
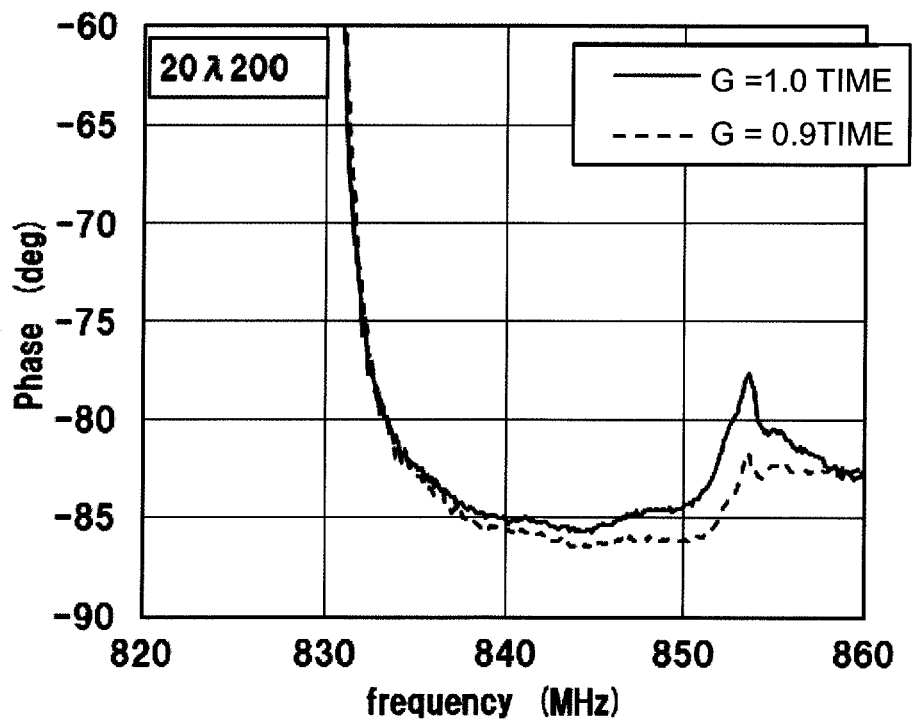

FIG. 16 is a conceptual diagram showing the passage characteristic of the ladder type filter and the frequency positions of impedance characteristics of the series arm resonators S1, S2, and S3 and the parallel arm resonators P1, P2, and P3. The characteristics positioned in the lower part are the impedance characteristics of the series arm resonators and parallel arm resonators. The characteristics of the series arm resonators are indicated by the solid line, and the characteristics of the parallel arm resonators are indicated by the broken line. Note that, the abscissa shows the frequencies, and the ordinate shows the impedances. By connecting such series arm resonators and parallel arm resonators in a ladder, the result functions as a filter. The filter passage characteristic of this filter is shown in the upper part in FIG. 16. Here, the ordinate shows the impedances, and the abscissa shows the frequencies.

As seen from the impedance characteristics shown in FIG. 16, the resonance point of the series arm resonators and the antiresonance point of the parallel arm resonators are positioned at almost the center of the filter pass band. The frequency corresponding to the end part on the high frequency side in the filter pass band is, as described by A in FIG. 16, positioned on the slightly higher frequency side than the antiresonance point of the parallel arm resonators.

When the SAW element 1 in the present embodiment is used for the parallel arm resonators P1 to P3, the loss in this frequency region can be reduced. Therefore, as a result, the loss in the vicinity of the end part on the high frequency side in the pass band of the filter can be reduced. Further, in the SAW element 1 in the present embodiment, the characteristics in the vicinity of the resonance frequency deteriorate. However, the vicinity of the resonance frequency of the parallel arm resonators P1 to P3 is located on the lower frequency side than the pass band of the filter, so a large demerit is prevented in the characteristics of the filter as a whole.

Further, in particular, by using at least the SAW element 1 for the parallel arm resonator having the lowest resonance frequency among the parallel arm resonators P1 to P3, in the pass band of the filter, the loss in the end part on the high frequency side is suppressed. As a result, the shoulder characteristic can be improved, therefore the sharpness in the pass band of the filter can be improved. That is, when the parallel arm resonators P1 to P3 include the first parallel arm resonator and the second parallel arm resonator having a higher resonance frequency than that, preferably the SAW element 1 is applied to the first parallel arm resonator. Further preferably, the resonance frequency of the first parallel arm resonator is the lowest among the parallel arm resonators.

The SAW element in the present invention is not limited to the embodiment explained above. Various changes may be made as well. For example, in the embodiment explained above, as the method of arranging the reflection electrode fingers 42 closer to the IDT electrode 3 side than the pitch of the plurality of electrode fingers 32 configuring the IDT electrode 3, the explanation was given of the case of narrowing the gap G, the case of narrowing the pitch Pt2 of the reflection electrode fingers 42, and the case of narrowing the pitch Pt1 of the electrode fingers 32. However, these may be combined as well.

That is, as the method of arranging the reflection electrode fingers 42 closer to the IDT electrode 3 side than the pitch of the plurality of electrode fingers 32 configuring the IDT electrode 3, the pitch Pt2 of the reflection electrode fingers 42 may be narrowed while narrowing the gap G as well. In this case, the width of narrowing the gap G and the width of narrowing the pitch Pt2 can be made smaller, therefore the deterioration of characteristic in each of the configurations can be reduced. Note that, the pitch Pt1 of the electrode fingers 32 in the IDT electrode 3 may be narrowed while narrowing the gap G or all of the gap G, pitch Pt1, and pitch Pt2 may be narrowed.

Further, the SAW element in the embodiment explained above exhibits its effects irrespective of the frequency of the pass band. In FIGS. 17A and 17B to FIGS. 22A and 22B, the frequency of the pass band was set to the 800 MHz band. However, it is seen that the same effects as those by the embodiment explained above are exerted. Specifically, in FIGS. 17A and 17B to FIGS. 22A and 22B, the abscissas show the frequencies (MHz), and the ordinates show the phases (deg). In these graphs, the characteristics of the SAW element where the gap G was set to 1.0 time the pitch Pt1 are shown by the solid lines, and the characteristics of the SAW element where the gap G was set to 0.9 time the pitch Pt1 are shown by the broken lines. Note that, the elements where the gap G is 1.0 time the pitch Pt1 are usual SAW elements. In all of these graphs, it was confirmed that a SAW element indicated by the broken line wherein the gap G was set to 0.9 time the pitch Pt1 had the phase closer to −90° on a higher frequency side than the antiresonance frequency than a SAW element wherein the gap G was set to 1.0 time, therefore the generation of loss was suppressed.

Further, the embodiment explained above showed the case where the number of the electrode fingers 32 in the IDT electrode 3 was set to 200. Contrary to this, SAW elements changed in the number of the electrode fingers 32 in the IDT electrode 3 from that of the fundamental configuration of the SAW element in the embodiment explained above were prepared and measured. The results are shown in FIGS. 17A and 17B to FIGS. 19A and 19B. Specifically, FIGS. 17A and 17B, 18A and 18B, and 19A and 19B show the results of measurement of the phase characteristics in the case where SAW elements with 100, 200, and 300 fingers in the IDT electrodes 3 were prepared. This is the case where the film thickness of an electrode finger 32 is set to 378 μm (including 6 nm of the underlying layer) so that the normalized film thickness becomes 7.7%. The normalized film thickness is the ratio of the film thickness of the electrode finger 32 relative to the wavelength of the acoustic wave ie 2×pitch pt1 and is obtained by dividing the film thickness of the electrode finger 32 by the wavelength.

As shown in FIGS. 17A and 17B to 19A and 19B, it is seen that the effects of the present invention are exerted irrespective of the number of electrode fingers 32.

On the other hand, as shown in FIGS. 20A and 20B to 22A and 22B, it is seen that the same effects as those by the SAW element in the present embodiment can be obtained even in the case where the film thickness of the electrode finger 32 is changed. FIGS. 20A and 20B to 22A and 22B show the results of measurement where the SAW elements with electrode film thicknesses changed so that the normalized film thickness changes in the SAW element in the embodiment explained above were prepared. Specifically, in FIGS. 20A and 20B to 22A and 22B, the thicknesses were set so that the normalized film thickness becomes 6.5% (electrode film thickness is 320 nm (including 6 nm of the underlying layer)), 7.7% (electrode film thickness is 378 nm (including 6 nm of the underlying layer)), and 8.2% (electrode film thickness is 400 nm (including 6 nm of the underlying layer)). It is apparent from this result that the loss on the high frequency side can be reduced irrespective of the film thickness of the electrode fingers 32. Particularly, when the film thickness is thin, it was seen that the effect of reduction of loss was large and the ripples could be made small as well.

REFERENCE SIGNS LIST

1: acoustic wave element (SAW element), 2: piezoelectric substrate, 2A: upper surface, 3: excitation electrode (IDT electrode), 30: comb-shaped electrode (first comb-shaped electrode 30a, second comb-shaped electrode 30b), 31: bus bar (first bus bar 31a, second bus bar 31b), 32: electrode finger (first electrode finger 32a, second electrode finger 32b), 33: dummy electrode finger (first dummy electrode finger 33a, second dummy electrode finger 33b), 3a: center vicinity, 4: reflector, 41: reflector bus bar, 42: reflection electrode finger, 5: protective layer, 7: duplexer, 8: antenna terminal, 9: transmission terminal, 10: reception terminal, 11: transmission filter, 12: receiving filter, 101: communication device, 103: RF-IC, 109: antenna, S1 to S3: series arm resonators, and P1 to P3: parallel arm resonators.

The invention claimed is:
1. An acoustic wave element comprising:
a piezoelectric substrate,
an excitation electrode which is on the piezoelectric substrate and comprises a plurality of electrode fingers, and
two reflectors on the piezoelectric substrate, each of which comprises a plurality of reflection electrode fingers, which sandwich the excitation electrode therebetween in the propagation direction of an acoustic wave, wherein
the excitation electrode comprises a main region in the vicinity of a center of a line of the plurality of electrode fingers in which the intervals between the centers of the plurality of electrode fingers are uniformly a first interval,
each of the reflector comprises a shift part in which at least one of the reflection electrode fingers shifts to the excitation electrode side relative to virtual electrode finger positions which are repeatedly set at the first intervals from the electrode fingers in the main region,
the plurality of the reflection electrode fingers comprises
a first reflection electrode finger which is on the excitation electrode side,
a second reflection electrode finger which is adjacent to the first reflection electrode finger and is on the opposite side to the excitation electrode and
third reflection electrode fingers which is a series of reflection electrode fingers on the opposite side to the excitation electrode relative to the second reflection electrode finger have an interval between their centers of the first interval or less and comprises a reflection electrode finger adjacent to the second reflection electrode, and, an interval between the centers of the first reflection electrode finger and the second reflection electrode finger is narrower than the first interval, and the shift parts comprises the second reflection electrode finger and the third reflection electrode fingers, and an interval between the center of the reflection electrode finger in the reflector which is located in the end part on the excitation electrode side and the center of the electrode finger in the excitation electrode which is located in the end part on the reflector side is the first interval.

2. The acoustic wave element according to claim 1, wherein the at least one of the reflection electrode fingers in the shift part shifts to the excitation electrode side within a range not more than 0.1λ from the virtual electrode finger positions when the wavelength of the acoustic wave in the excitation electrode is λ.

3. The acoustic wave element according to claim 1, wherein the first reflection electrode finger is located in the end part in the reflector on the excitation electrode side.

4. The acoustic wave element according to claim 1, wherein the reflection electrode fingers in the shift part shifts to the excitation electrode side within a range of 0.8 to 0.975 times the first interval from the virtual electrode finger position.

5. The acoustic wave element according to claim 1, wherein the reflection electrode fingers in the shift part shifts to the excitation electrode side within a range of 0.025λ to 0.075λ from the virtual electrode finger position, where a wavelength of the acoustic wave in the excitation electrode is λ.

6. The acoustic wave element according to claim 1, wherein the reflector comprises 10 or more reflection electrode fingers, and the first reflection electrode finger is located in range from the end part in the reflector on the excitation electrode side to a sixth finger.

7. A filter element comprising at least one series arm resonator connected between an input and output terminals and at least one parallel arm resonator, wherein the parallel arm resonator is the acoustic wave element according to claim 1.

8. The filter element according to claim 7 wherein
the at least one parallel arm resonator is a plurality of resonators and includes a first parallel arm resonator and a second parallel arm resonator having a higher resonance frequency than the first parallel arm resonator, and
the first parallel arm resonator is the acoustic wave element.

9. A communication device comprising:
an antenna,
a filter element according to claim 7 which is electrically connected to the antenna, and
an RF-IC which is electrically connected to the filter element.

10. The acoustic wave element according to claim 1, wherein every interval between the centers of the reflection electrode fingers and the reflection electrode fingers except the interval between the centers of the first reflection electrode finger and the second reflection electrode finger of each of the reflectors is the first interval.

11. The acoustic wave element comprising:
a piezoelectric substrate,
an excitation electrode which is on the piezoelectric substrate and comprises a plurality of electrode fingers, and
two reflectors on the piezoelectric substrate, each of which comprises a plurality of reflection electrode fingers, which sandwich the excitation electrode therebetween in the propagation direction of an acoustic wave, wherein the excitation electrode comprises a main region in the vicinity of a center of a line of the plurality of electrode fingers in which the intervals between the centers of the plurality of electrode fingers are uniformly a first interval, each of the reflector comprises a shift part in which at least one of the reflection electrode fingers shifts to the excitation electrode side relative to virtual electrode finger positions which are repeatedly set at the first intervals from the electrode fingers in the main region, and in the excitation electrode, an interval between the centers of at least two of the electrode fingers which are located on the reflector side and adjoin each other is narrower than the first interval.

12. The acoustic wave element according to claim 11, wherein, in the excitation electrode, said at least two of the electrode fingers which are located on the reflector side and adjoin each other include the electrode finger which is located in the end part of the excitation electrode on the reflector side.

13. The acoustic wave element according to claim 11, wherein every interval between the centers of the reflection electrode fingers and the reflection electrode fingers except the interval between the centers of the two of the electrode fingers on each of the reflector sides which is narrower than the first interval is the first interval.

14. The acoustic wave element according to claim 11, wherein the at least one of the reflection electrode fingers in the shift part shifts to the excitation electrode side within a range not more than 0.1λ from the virtual electrode finger positions when the wavelength of the acoustic wave in the excitation electrode is λ.

15. A filter element comprising at least one series arm resonator connected between an input and output terminals and at least one parallel arm resonator, wherein the parallel arm resonator is an acoustic wave element according to claim 11.

16. An acoustic wave element comprising:
a piezoelectric substrate,
an excitation electrode which is on the piezoelectric substrate and comprises a plurality of electrode fingers, and
two reflectors on the piezoelectric substrate, each of which comprises a plurality of reflection electrode fingers, which sandwich the excitation electrode therebetween in the propagation direction of an acoustic wave, wherein the excitation electrode comprises a main region in the vicinity of the center of the line of the plurality of electrode fingers in which the intervals between the centers of the plurality of electrode fingers are uniformly a first interval, each of the reflector comprises a shift part in which at least one of the reflection electrode fingers shifts to the excitation electrode side relative to virtual electrode finger positions which are repeatedly set at the first intervals from the electrode fingers in the main region, the plurality of the reflection electrode fingers comprises a first reflection electrode finger which is on the excitation electrode side, a second reflection electrode finger which is adjacent to the first reflection electrode finger and is on the opposite side to the excitation electrode and third reflection electrode fingers which is a series of reflection electrode fingers on the opposite side to the excitation electrode relative to the second reflection electrode finger have an interval between their centers of the first interval or less and comprises a reflection electrode finger adjacent to the second reflection electrode, and, an interval between the centers of the first reflection electrode finger and the second reflection electrode finger is singularly narrower than the first interval, and the shift parts comprises the second reflection electrode finger and the third reflection electrode fingers.

17. The acoustic wave element according to claim 16, wherein an interval between the center of the reflection electrode finger in the reflector which is located in the end part on the excitation electrode side and the center of the electrode finger in the excitation electrode which is located in the end part on the reflector side is narrower than the first interval.

18. The acoustic wave element according to claim 16, wherein the at least one of the reflection electrode fingers in the shift part shifts to the excitation electrode side within a range not more than $0.1\lambda$ from the virtual electrode finger positions when the wavelength of the acoustic wave in the excitation electrode is $\lambda$.

19. The acoustic wave element according to claim 16, wherein an interval between the center of the reflection electrode finger in the reflector which is located in the end part on the excitation electrode side and the center of the electrode finger in the excitation electrode which is located in the end part on the reflector side is the first interval.

20. A filter element comprising at least one series arm resonator connected between an input and output terminals and at least one parallel arm resonator, wherein the parallel arm resonator is an acoustic wave element according to claim 16.

* * * * *